(12) United States Patent
Yanagita et al.

(10) Patent No.: US 8,570,412 B2
(45) Date of Patent: Oct. 29, 2013

(54) SOLID STATE IMAGE SENSOR, METHOD FOR DRIVING A SOLID STATE IMAGE SENSOR, IMAGING APPARATUS, AND ELECTRONIC DEVICE

(75) Inventors: Takeshi Yanagita, Tokyo (JP); Keiji Mabuchi, Kanagawa (JP); Hiroaki Ishiwata, Tokyo (JP)

(73) Assignee: Sony Corporation (JP)

( * ) Notice: Subject to any disclaimer, the term of this patent is extended or adjusted under 35 U.S.C. 154(b) by 409 days.

(21) Appl. No.: 12/603,059

(22) Filed: Oct. 21, 2009

(65) Prior Publication Data
US 2010/0097508 A1 Apr. 22, 2010

(30) Foreign Application Priority Data

Oct. 22, 2008 (JP) .................................. 2008-271673
Dec. 12, 2008 (JP) .................................. 2008-316452
May 29, 2009 (JP) .................................. 2009-129783

(51) Int. Cl.
*H04N 5/335* (2011.01)
(52) U.S. Cl.
USPC .......................... 348/301; 348/300; 348/308
(58) Field of Classification Search
None
See application file for complete search history.

(56) References Cited

U.S. PATENT DOCUMENTS

| 6,388,242 | B1 | 5/2002 | Bock |
| 6,734,906 | B1 | 5/2004 | Hashimoto |
| 7,053,945 | B1 * | 5/2006 | Xue .............................. 348/294 |
| 7,334,211 | B1 | 2/2008 | Toros et al. |
| 8,026,967 | B2 * | 9/2011 | Shah ............................. 348/296 |
| 2004/0174450 | A1 * | 9/2004 | Lee et al. ...................... 348/308 |
| 2005/0128327 | A1 | 6/2005 | Bencuya |
| 2005/0205902 | A1 | 9/2005 | Hara et al. |
| 2006/0043440 | A1 * | 3/2006 | Hiyama et al. ................ 257/291 |
| 2007/0164332 | A1 | 7/2007 | Paik et al. |
| 2008/0180558 | A1 | 7/2008 | Watanabe |
| 2008/0284882 | A1 * | 11/2008 | Mori et al. ..................... 348/294 |
| 2009/0046186 | A1 * | 2/2009 | Nagai ............................ 348/301 |
| 2010/0060763 | A1 * | 3/2010 | Hiyama et al. ................ 348/300 |

FOREIGN PATENT DOCUMENTS

| EP | 1 605 685 A1 | 12/2005 |
| EP | 1605685 | 12/2005 |
| EP | 1 804 297 A1 | 7/2007 |

(Continued)

OTHER PUBLICATIONS

European Search Report dated Nov. 7, 2011 in connection with counterpart EP Application No. EP 11 00 6885.

(Continued)

*Primary Examiner* — Lin Ye
*Assistant Examiner* — John H Morehead, III
(74) *Attorney, Agent, or Firm* — Sheridan Ross P.C.

(57) ABSTRACT

A solid state image sensor includes a pixel array, as well as charge-to-voltage converters, reset gates, and amplifiers each shared by a plurality of pixels in the array. The voltage level of the reset gate power supply is set higher than the voltage level of the amplifier power supply. Additionally, charge overflowing from photodetectors in the pixels may be discarded into the charge-to-voltage converters. The image sensor may also include a row scanner configured such that, while scanning a row in the pixel array to read out signals therefrom, the row scanner resets the charge in the photodetectors of the pixels sharing a charge-to-voltage converter with pixels on the readout row. The charge reset is conducted simultaneously with or prior to reading out the signals from the pixels on the readout row.

14 Claims, 24 Drawing Sheets

(56) References Cited

FOREIGN PATENT DOCUMENTS

| | | |
|---|---|---|
| EP | 1804297 | 7/2007 |
| EP | 2 065 938 A2 | 6/2009 |
| JP | HEI 07-087400 A | 3/1995 |
| JP | 11-112018 | 4/1999 |
| JP | HEI 11-331713 A | 11/1999 |
| JP | 2001-241491 | 9/2001 |
| JP | 2004-215048 A | 7/2004 |
| JP | 2004-241491 A | 8/2004 |
| JP | 2005-268537 | 9/2005 |
| JP | 206 210468 A | 8/2006 |
| JP | 2006-222427 | 8/2006 |
| JP | 2007-067379 | 3/2007 |
| JP | 2007-104186 | 4/2007 |
| JP | 2007-123765 | 5/2007 |
| JP | 2007-124217 | 5/2007 |
| JP | 2007-180336 | 7/2007 |
| JP | 2007-201863 | 8/2007 |
| JP | 2007-115994 | 10/2007 |
| JP | 2008-167003 | 7/2008 |
| JP | 2008-172580 | 7/2008 |
| JP | 2008-172607 | 7/2008 |
| JP | 2008-177706 | 7/2008 |
| JP | 2008-288904 | 11/2008 |
| JP | 2008-294218 A | 12/2008 |
| JP | 2009-518850 | 5/2009 |
| WO | 2006/130516 A1 | 12/2006 |
| WO | WO 2007/066996 | 6/2007 |

OTHER PUBLICATIONS

European Search Report corresponding to European Serial No. 09013174 dated Jan. 25, 2010.

Sony Corporation; EP Application No. 09 013 174.9; European Extended Search Report, mailed Feb. 21, 2011; 16 pages.

Japanese Patent Office Action corresponding to Japanese Serial No. 2008-271673 dated Jul. 6, 2010.

JP Application No. 2009-129783; Office Action issued Apr. 12, 2011; 4 pages.

Japanese Office Action issued on Aug. 25, 2011 in connection with counterpart JP Application No. 2008-316452.

Japanese Patent Office, Office Action issued in Patent Application JP 2008-316452, on Aug. 26, 2010.

Japanese Patent Office, Office Action issued in Patent Application JP 2008-271673, on Sep. 21, 2010.

Japanese Office Action issued on Aug. 28, 2012, in connection with counterpart JP Application No. 201-131330.

Official Action for Japan Patent Application No. 2010-283004, dated Dec. 11, 2012, 3 pages.

Extended European Search Report for European Patent Application No. 13000767.7 dated Apr. 17, 2013, 8 pages.

\* cited by examiner

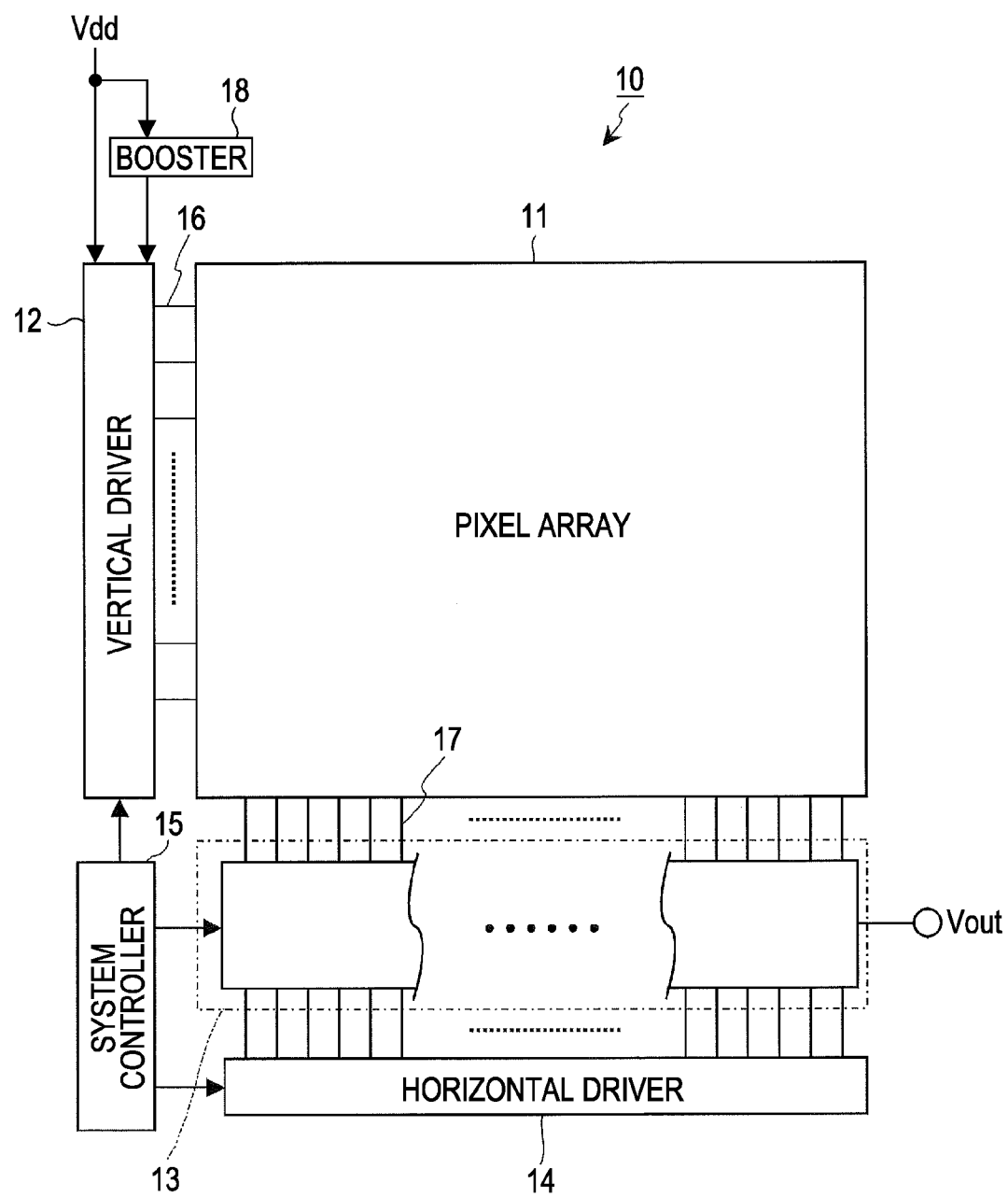

○ : READOUT TIMING FOR READOUT ROW
□ : ELECTRONIC SHUTTER TIMING FOR READOUT ROW
× : ANTI-BLOOMING SHUTTER TIMING FOR SHARING PIXELS

SOLID STATE IMAGE SENSOR, METHOD FOR DRIVING A SOLID STATE IMAGE SENSOR, IMAGING APPARATUS, AND ELECTRONIC DEVICE

BACKGROUND OF THE INVENTION

1. Field of the Invention

The present invention relates to a solid state image sensor, a method for driving a solid state image sensor, an imaging apparatus, and an electronic device.

2. Description of the Related Art

Amplified solid state image sensors are one category of solid state image sensors that use an X-Y addressing scheme. Amplified solid state image sensors include, for example, CMOS (Complementary Metal Oxide Semiconductor) solid state image sensors (this also includes MOS devices). Hereinafter, such solid state image sensors are referred to as CMOS image sensors.

In a CMOS image sensor, a plurality of pixels containing photodetectors are arranged in a two-dimensional array. In addition to a photodetector, each individual pixel also includes within its pixel boundary many component elements (transistors, for example) that constitute components such as a read gate, a reset gate, and an amplifier. For this reason, there exist limits when attempting to miniaturize pixels.

Recently, however, multi-pixel sharing architectures have been proposed, wherein a portion of the component elements that have been typically provided on a per-pixel basis are instead shared among a plurality of pixels. In so doing, the per-pixel footprint (excluding the photodetector) is suppressed. Such multi-pixel sharing architectures are becoming a vital technology in the design of miniaturized pixels for CMOS imagers.

One such multi-pixel function sharing architecture involves arranging, between two photodetectors, a charge-to-voltage converter supplying the two photodetectors, as well as other component element groups (i.e., transistor groups constituting a reset gate and other components) (see, for example, U.S. Pat. No. 6,423,994). Another architecture involves sharing a charge-to-voltage converter and other component element groups between two photodetectors, while additionally arranging the shared component element groups so as to be in-line with each photodetector (see, for example, Japanese Unexamined Patent Application Publication No. 2001-298177).

In such CMOS image sensors, the pixel architecture is typically front-illuminated such that incident light is captured on the front side, where the front side is taken to be the side upon which the metal layer with respect to the photodetectors is disposed. In contrast, however, there also exist back-illuminated pixel architectures such that incident light is captured on the back side, or in other words, the side opposite that of the metal layer (see, for example, Japanese Unexamined Patent Application Publication No. 2003-031785).

Meanwhile, in order to prevent charge overflowing from the photodetector from bleeding into an adjacent pixel, front-illuminated pixel architectures typically adopt the vertical overflow drain architecture shown in FIG. 1. This vertical overflow drain architecture involves setting the potential barrier of the floor of the photodetector (PD) 51 lower than the potential barrier under the transfer gate 53, and discarding charge overflowing from the photodetector 51 into the substrate 52.

Meanwhile, since there is no substrate in the back-illuminated pixel architecture, charge overflowing from the photodetectors is not discarded as described above. Thus, a back-illuminated pixel architecture adopts a horizontal overflow drain architecture, wherein charge overflowing from the photodetector 51 is passed under the transfer gate 53 and discarded into a floating diffusion (hereinafter referred to as an FD). Incidentally, preventing charge overflowing from the photodetector 51 from bleeding into an adjacent pixel also suppresses blooming (the phenomenon whereby portions not receiving incident light also appear bright).

Another anti-blooming technology involves activating an electronic anti-blooming shutter simultaneously with the electronic shutter that regulates the exposure time (i.e., the charge accumulation time). The electronic anti-blooming shutter is even activated with respect to pixel rows whose charge is not read at all during a single frame period (see, for example, Japanese Unexamined Patent Application Publication No. 2008-288904). This other anti-blooming technology is principally designed for front-illuminated solid state image sensors, and is configured to discard the charge of the photodetector 51 into the power supply via the FD 54.

In addition, in recent years apparatus that make use of solid state image sensors, such as digital still cameras and digital camcorders, are becoming more widely used. Moreover, in the field of mobile phones and similar mobile handsets, products incorporating camera functions are becoming the norm. There is a tendency for CMOS (Complementary Oxide Metal Semiconductor) image sensors (CIS) to be used rather than CCDs (Charge Coupled Devices) in such applications.

In a CIS, each pixel includes a photodetector (PD) as well as a transfer transistor (TRF). Typically, each pixel also includes a floating diffusion (FD), an amplifier transistor (AMP), a reset transistor (RST), and a selection transistor (SEL).

Although such CIS sensors are being applied to mobile phones, recently there has been demand for more detailed images. In order to meet this demand, pixel sizes have been miniaturized from 2.5 μm, to 2.0 μm, to 1.75 μm over the years, thereby realizing increased numbers of pixels. Meanwhile, there has also been demand for reduction in the size of the camera module, in order to make the mobile phone itself smaller in size. In order to meet this demand, the pixel size and the optics size has been reduced, thereby realizing a reduction in the size of the camera module. The demand for pixel size reduction is ongoing.

On the other hand, if the pixel size is made smaller, then the surface area of the photodiode that converts incident light into an electrical signal also becomes smaller. This results in a decrease in factors such as sensitivity and saturation signal strength, which degrades imaging performance. In order to prevent such degradation, it has been proposed that the floating diffusion, the amplifier transistor, the reset transistor, and the selection transistor be shared among a plurality of pixels. It has been proposed that by sharing, the number of transistors per pixel can be decreased, and the surface area of the photodiode can be increased.

For example, in the configuration proposed in Japanese Unexamined Patent Application Publication No. 2007-201863, the floating diffusion is shared among four pixels arranged in a 2×2 layout in the horizontal and vertical directions, and the surface area of the photodiode is increased. Furthermore, in the configuration proposed in Japanese Unexamined Patent Application Publication No. 2005-268537, the drain potential of the reset transistor and the drain potential of the amplifier transistor are set individually.

FIG. 25 illustrates an exemplary configuration of an imaging apparatus described in JP-A-2005-268537. The imaging apparatus shown in FIG. 25 is formed from two pixel units PD1 and PD2. The pixel unit PD1 includes: a photodiode 1 having photoelectric conversion functions; a transfer transistor 2 that transmits photocarriers accumulated in the photodiode 1 to a floating diffusion; and a reset transistor 3 for resetting the potential of the floating diffusion.

The pixel unit PD2 includes: a photodiode 4 having photoelectric conversion functions; a transfer transistor 5 that transmits photocarriers accumulated in the photodiode 4 to the floating diffusion; and an amplifier transistor 6 that amplifies and outputs the signal transmitted to the floating diffusion.

The pixel units PD1 and PD2 are electrically connected to each other by the floating diffusion. The photodiode 1 and the transfer transistor 2 are connected in series between a fixed potential GND and the floating diffusion. The gate of the transfer transistor 2 is electrically connected to a control terminal 7 that accepts a control signal TX1 as input. The reset transistor 3 is disposed between the floating diffusion FD and a control terminal 9, to which a control potential Vref1 is applied. The gate of the reset transistor 3 is electrically connected to a control terminal 8 that accepts a reset control signal RST as input.

The photodiode 4 and the transfer transistor 5 are connected in series between the fixed potential GND and the floating diffusion. The gate of the transfer transistor 5 is electrically connected to a control terminal 10 that accepts a control signal TX2 as input. The amplifier transistor 6 is disposed between a control terminal 11, to which a control potential Vref2 is applied, and an output terminal 12 that outputs the amplified signal. The gate of the amplifier transistor 6 is electrically connected to the floating diffusion FD.

SUMMARY OF THE INVENTION

Having miniaturized pixels by implementing a multi-pixel sharing architecture, if further pixel miniaturization entailed by increased pixel resolutions is to be considered in order to meet the demand for more detailed images, then it is desirable to reduce the footprint of the photodetectors to match the size reduction in the pixel footprint. However, it becomes difficult to obtain sufficient saturation characteristics if the footprint of the photodetectors is reduced, since the quantity of charge handled by each photodetector (i.e., the quantity of charge that can be accumulated) is decreased as a result.

Consequently, it is desirable to provide a solid state image sensor able to obtain sufficient saturation characteristics after having miniaturized the pixels therein by implementing a multi-pixel sharing architecture. It is furthermore desirable to provide a method for driving such a solid state image sensor, as well as an imaging apparatus using such a solid state image sensor.

When a multi-pixel sharing architecture is implemented in a back-illuminated pixel architecture, the charge within the photodetectors of pixels sharing an FD is discarded in advance with respect to the readout row. If the charge is not discarded, problems like the following occur. If charge lingers within the photodetectors of the pixels sharing an FD, then the charge passes under the low potential barrier transfer gates and bleeds into the FD of the pixels on the readout row. For this reason, the linearity of the signal output is not maintained, as this signal output is dependent on the charge accumulation time as regulated by the electronic shutter. (Further details will be given later.)

Although the above describes a problem regarding back-illuminated pixel architectures that have implemented a multi-pixel sharing architecture, a similar problem can be said to exist for front-illuminated pixel architectures adopting a horizontal overflow drain architecture. More specifically, the problem of linearity not being maintained for the signal output that depends on the charge accumulation time can be said to apply generally to all solid state image sensors having a horizontal overflow drain architecture and also adopting a multi-pixel sharing architecture.

It is therefore desirable to provide a solid state image sensor having a horizontal overflow drain architecture able to maintain the linearity of the signal output that depends on the charge accumulation time when adopting a multi-pixel sharing architecture. It is furthermore desirable to provide a method for driving such a solid state image sensor, as well as an electronic device including such a solid state image sensor.

In JP-A-2007-201863, it is proposed that the floating diffusion be shared among four pixels. However, there is a possibility that the layout will become large, even if configuring an imaging apparatus by arranging such groups of four pixels. Furthermore, there is a possibility that imaging performance will degrade, even though reduced size may be achieved. In other words, it is difficult to favorably realize a reduced size such that image performance is not degraded.

In JP-A-2005-268537, a reset transistor and an amplifier transistor are separately disposed in the respective pixel area of two pixels. In other words, in JP-A-2005-268537, the reset transistor and the amplifier transistor are shared among pixels, but are still electrically connected by leads. For this reason, the number of leads is increased, and as a result, there are potential difficulties in miniaturization.

In light of the foregoing circumstances, it is desirable to suppress the degradation of imaging performance, even when the pixel size is decreased.

A solid state image sensor in accordance with an embodiment of the present invention includes: a plurality of charge-to-voltage converters; a pixel array having a plurality of pixels arranged therein, wherein each pixel includes a photodetector as well as a transfer gate configured to transfer charge photoelectrically converted by the photodetector to one of the charge-to-voltage converters; a plurality of reset gates configured to reset the photodetectors; and a plurality of amplifiers configured to output a signal corresponding to the potential of the photodetectors. Herein, each charge-to-voltage converter, reset gate, and amplifier are shared among a plurality of pixels. In addition, the voltage level of the reset gate power supply is set higher than the voltage level of the amplifier power supply.

The reset gate resets the charge-to-voltage converter to a reset voltage, which is set to a voltage level that is higher than the voltage level of the amplifier power supply. In so doing, the potential of the charge-to-voltage converter becomes deeper (i.e., greater in magnitude) than that of the case when the reset voltage is set to the voltage level of the amplifier power supply. If the potential of the charge-to-voltage converter at reset can be made deep, then the potential of the photodetectors can be designed to be deep to an equivalent degree. As a result, the quantity of charge handled by the photodetectors can be increased beyond that of the case when the reset voltage is set to the voltage level of the amplifier power supply.

A solid state image sensor in accordance with another embodiment of the present invention includes: a plurality of charge-to-voltage converters; a pixel array having a plurality of pixels arranged therein, wherein each pixel includes a photodetector as well as a transfer gate configured to transfer charge photoelectrically converted by the photodetector to one of the charge-to-voltage converters; a plurality of reset gates configured to reset the photodetectors; and a plurality of amplifiers configured to output a signal corresponding to the potential of the photodetectors. Herein, each charge-to-voltage converter, reset gate, and amplifier are shared among a plurality of pixels. The plurality of pixels is defined to be four consecutive pixels belonging to the same pixel column, while in addition, adjacent pixels among the four pixels are paired into two groups. In one group, a charge-to-voltage converter and a reset gate are shared between the two pixels therein, with the reset gate being disposed between the respective photodetector regions of the two pixels. In the other group, a charge-to-voltage converter and an amplifier are shared between the two pixels therein, with the amplifier being disposed between the respective photodetector regions of the two pixels.

In each group, a charge-to-voltage converter is shared between the two pixels therein, with either a reset gate or an amplifier provided between the two pixels. The resulting layout is efficient for securing the area occupied by the photodetectors. Consequently, a large footprint for a photodetector can be acquired within a limited pixel boundary, even when attempting to further miniaturize pixels by adopting a multi-pixel sharing architecture in order to meet the demand for more detailed images.

A solid state image sensor in accordance with another embodiment of the present invention includes: a plurality of charge-to-voltage converters; and a pixel array having a plurality of pixels arranged therein, wherein each pixel includes a photodetector as well as a transfer gate configured to transfer charge photoelectrically converted by the photodetector to one of the charge-to-voltage converters. The pixel array is configured such that charge overflowing from one of the photodetectors passes through one of the transfer gates and is discarded into one of the charge-to-voltage converters. The pixel array is also configured such that at least each charge-to-voltage converter is shared among a plurality of pixels. While scanning a row to read out signals from respective pixels in the pixel array, the charge is reset in the photodetectors of the pixels sharing a charge-to-voltage converter with pixels on the readout row (i.e., sharing pixels). The charge reset is conducted simultaneously with or prior to reading out the signals from the pixels on the readout row.

The architecture whereby charge overflowing from the photodetector passes through the transfer gate and is discarded into the charge-to-voltage converter is a horizontal overflow drain architecture. In a solid state image sensor having such a horizontal overflow drain architecture and configured such that each charge-to-voltage converter is shared among a plurality of pixels, the charge in the photodetectors of the sharing pixels is reset simultaneously with or prior to reading out the signals from the pixels on the readout row. As a result of this reset operation, any charge lingering in the photodetectors of the sharing pixels is discarded. For this reason, charge overflowing from the photodetectors of the sharing pixels does not bleed into the charge-to-voltage converters before the signals are read out from the pixels on the readout row.

An imaging apparatus in accordance with another embodiment of the present invention includes: a pixel array having a plurality of pixels arranged therein, wherein each pixel includes a transfer transistor; a plurality of floating diffusion regions, each provided in the center of four pixels arranged in a 2×2 layout in the horizontal and vertical directions; a plurality of amplifier transistors; and a plurality of reset transistors. The transfer transistors constituting the four pixels are disposed in four directions around the floating diffusion, such that the floating diffusion is enclosed by the transfer transistors. Each floating diffusion, amplifier transistor, and reset transistor are shared among the four pixels. A group of eight pixels formed by vertically disposing two sets of the four pixels is taken to be the basic component unit of the pixel array.

The drain electrode of each reset transistor and the drain electrode of each amplifier transistor may be disposed separately.

A pulse may be applied to the drain electrode of each reset transistor, while a constant potential may be applied to the drain electrode of each amplifier transistor.

The High potential at the drain electrode of the reset transistor may be set higher than the drain potential of the amplifier transistor.

The signal output lines from the pixels may be joined every two columns.

In an imaging apparatus in accordance with another embodiment of the present invention, each floating diffusion may be provided in the center of four pixels arranged in a 2×2 layout in the horizontal and vertical directions, such that each floating diffusion is enclosed by the transfer transistors. Additionally, each floating diffusion, amplifier transistor, and reset transistor may be shared among four pixels.

According to an embodiment of the present invention, the quantity of charge handled by a photodetector can be increased, even when the photodetector footprint is reduced to match the size reduction in the pixel area. For this reason, saturation characteristics can be obtained that are higher than those of the case wherein the reset voltage is set to the voltage level of the amplifier power supply.

Furthermore, a large footprint for a photodetector can be acquired within a limited pixel boundary and the quantity of charge handled by the photodetector can be increased, even when the pixel area is reduced for pixel miniaturization. For this reason, saturation characteristics can be obtained that are higher than those of architectures not adopting a layout in accordance with an embodiment of the present invention.

According to another embodiment of the present invention, charge overflowing from the photodetector of a sharing pixel does not bleed into a charge-to-voltage converter in a solid state image sensor having a horizontal overflow drain architecture. For this reason, linearity is maintained for the signal output that depends on the charge accumulation time in the pixels on the readout row.

According to another embodiment of the present invention, the degradation of imaging performance is suppressed, even when the pixel size is decreased.

BRIEF DESCRIPTION OF THE DRAWINGS

FIG. 3 is a system diagram summarizing the configuration of a CMOS image sensor to which an embodiment of the present invention has been applied;

DESCRIPTION OF THE PREFERRED EMBODIMENTS

Figure 1:
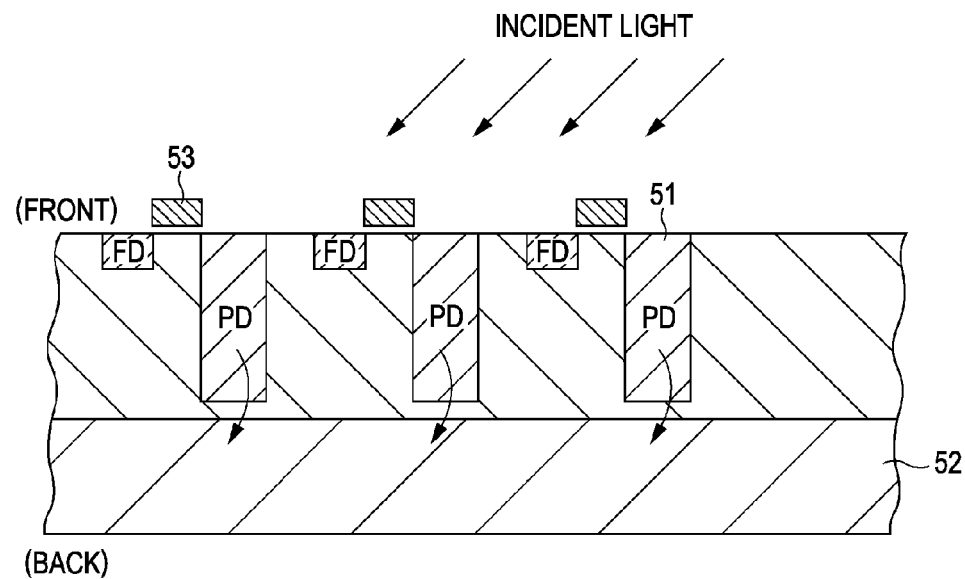
FIG. 1 is a cross-section illustrating a front-illuminated pixel architecture.
Figure 2:
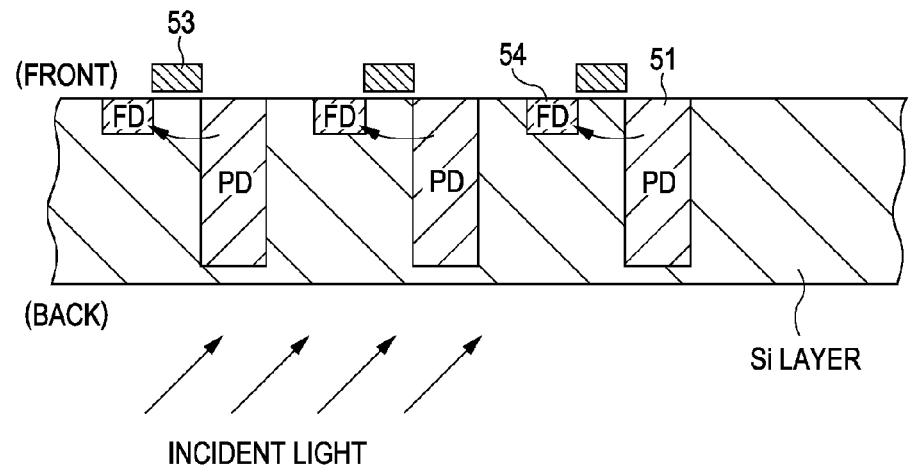
FIG. 2 is a cross-section illustrating a back-illuminated pixel architecture.

Hereinafter, embodiments of the present invention will be described in detail and with reference to the accompanying drawings.

[System Configuration]

FIG. 3 is a system diagram summarizing the configuration of a solid state image sensor, such as a CMOS image sensor, to which an embodiment of the present invention has been applied.

Hereinafter, respective components are indicated by the following reference numbers: the CMOS image sensor 10, the pixel array 11, the vertical driver 12, the column processor 13, the horizontal driver 14, the system controller 15, the pixel drive line 16, the vertical signal line 17, the booster circuit 18, the pixels 20 (20-1 to 20-4), the photodiodes 21 (21-1 to 21-4), the transfer transistors 22 (22-1 to 22-4), the reset transistor 23, the amplifier transistor 24, and the floating diffusion (FD) 25.

As shown in FIG. 3, the CMOS image sensor 10 in accordance with the present embodiment is configured having the pixel array 11 formed on a semiconductor substrate (i.e., a chip; not shown), as well as peripheral circuits integrated onto the same semiconductor substrate as the pixel array 11, for example. The provided peripheral circuits may include, for example, the vertical driver 12, the column processor 13, the horizontal driver 14, the system controller 15, and the booster circuit 18.

In the pixel array 11, unit pixels (hereinafter also simply referred to as pixels; not shown) are arranged in a two-dimensional array. Each unit pixel contains a photodetector that photoelectrically converts incident visible light into an electric charge corresponding to the light intensity. A more specific configuration of the pixels will be given later.

Additionally, pixel drive lines 16 are formed in the pixel array 11 with respect to each pixel row, and extending left to right as shown in FIG. 3 (i.e., the direction in which pixels are arranged into rows). Vertical signal lines 17 are likewise formed with respect to each column, and extending bottom to top as shown in FIG. 3 (i.e., the direction in which pixels are arranged into columns). Although just one line is shown in FIG. 3, the number of pixel drive lines 16 is not limited to one. One end of each pixel drive line 16 is connected to a per-row output terminal in the vertical driver 12.

The vertical driver 12 may be realized by means of components such as a shift register or an address decoder. Although the specific configuration is omitted from illustration herein, the vertical driver 12 is configured to include a readout scan subsystem and a reset scan subsystem. The readout scan subsystem selectively scans unit pixels in order by rows to read out signals therefrom.

Meanwhile, the reset scan subsystem conducts a reset scans that resets (i.e., discharges) unwanted charge from the photodetectors of the unit pixels on a readout row to be scanned by the readout scan subsystem. The reset scan precedes the readout scan by an amount of time equal to the shutter speed. By resetting (i.e., discharging) unwanted charge by means of the reset scan subsystem, an electronic shutter operation is conducted. Herein, an electronic shutter operation refers to an operation whereby photoelectric charge in the photodetectors is discarded and a new exposure is initiated (i.e., the accumulation of photoelectric charge is initiated).

The signals read out by the readout operation of the readout scan subsystem correspond to the intensity of light incident since the last readout operation or electronic shutter operation. The period of time starting at either the readout timing of the last readout operation or the reset timing of the last electronic shutter operation, and ending at the readout timing of the current readout operation, becomes the photoelectric charge accumulation time (i.e., the exposure time) for the unit pixels.

The signals output from respective unit pixels on the pixel row selectively scanned by the vertical driver 12 are supplied to the column processor 13 via individual vertical signal lines 17. For each pixel column of the pixel array 11, the column processor 13 conducts various signal processing with respect to the analog pixel signal output from an individual pixel 20 on the selected row.

The signal processing conducted by the column processor 13 may include, for example, correlated double sampling (CDS) for removing pixel-specific, fixed-pattern noise. It is also possible to incorporate into the column processor 13 AD conversion functions for converting analog pixel signals into digital pixel signals.

The horizontal driver 14 may be realized by means of components such as a shift register or an address decoder, and sequentially selects circuit portions corresponding to pixel columns in the column processor 13. As a result of the select scans performed by the horizontal driver 14, pixel signals processed by the column processor 13 are output in sequential order.

The system controller 15 may be realized by means of a timing generator that generates various timing signals. The system controller 15 controls the driving of the vertical driver 12, the column processor 13, and the horizontal driver 14 on the basis of the various timing signals generated by the timing generator.

The booster circuit 18 takes the voltage level Vdd of the power supply voltage used by components such as the vertical driver 12, and boosts the voltage level to a level Vdd+α that is higher than the voltage level Vdd. A common charge pump circuit, for example, may be used as the booster circuit 18. The voltage level Vdd+α that has been boosted by the booster circuit 18 is used as the high voltage level of a selecting power supply SELVdd that conducts pixel selection. Further details will be given later.

(Illumination Architecture)

There are two architectures whereby light illuminates the photodetectors in the pixels: a front-illuminated architecture, wherein light shines onto the front surface of the semiconductor substrate whereupon the photodetectors are formed; and a back-illuminated architecture, wherein light shines onto the back surface of the semiconductor substrate. The CMOS image sensor 10 as configured above is compatible with both front-illuminated and back-illuminated architectures. The configuration of these illumination architectures will now be summarized below.

Figure 4A:
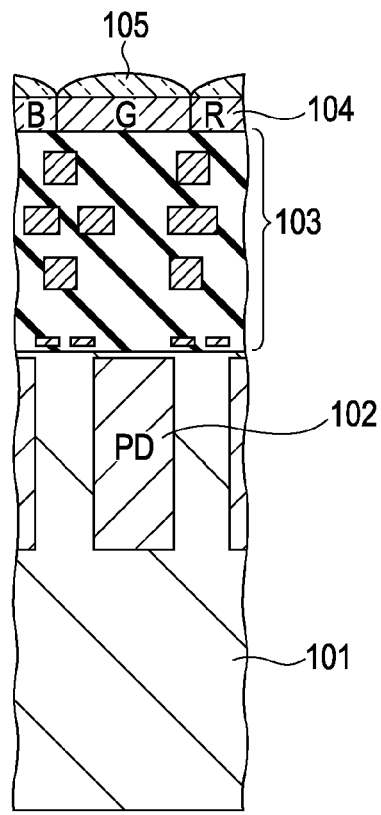
FIG. 4A is a cross-section summarizing a front-illuminated pixel architecture.
Figure 4B:
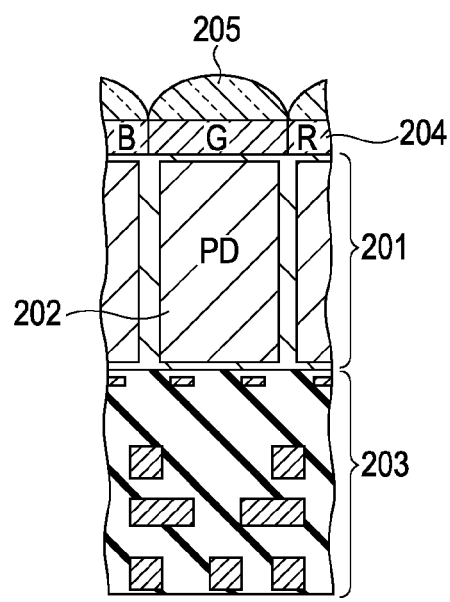
FIG. 4B is a cross-section summarizing a back-illuminated pixel architecture.

FIGS. 4A and 4B respectively architectures whereby light illuminates the photodetectors of pixels. FIG. 4A is a cross-section summarizing a front-illuminated pixel architecture. FIG. 4B is a cross-section summarizing a back-illuminated pixel architecture.

<Front-Illuminated Architecture>

As shown in FIG. 4A, in the front-illuminated architecture, a photodetector is realized by forming a photodiode (PD) 102 on one surface (i.e., the front surface) of a semiconductor substrate 101. A metal layer 103 is provided on top of the photodiode 102. On top of the metal layer 103, a color filter 104 and a microlens 105 are disposed, in that order.

As described earlier, since in the front-illuminated architecture the metal layer 103 is positioned on the side where light is captured by the CMOS image sensor 10, the wire layout in the metal layer 103 is designed to avoid the path of incident light. However, there are limits to how well the wire layout in the metal layer 103 can be designed to avoid the light path. Consequently, incident light is made to pass between the wires and be focused onto the photodiode 102 by the microlens 105. It is possible to apply all embodiments of the present invention to a front-illuminated solid state image sensor, with each embodiment exhibiting its specific advantages therein.

<Back-Illuminated Architecture>

As shown in FIG. 4B, in the back-illuminated architecture, a photodetector is realized by forming a photodiode (PD) 202 on an element layer 201 formed by polishing the semiconductor substrate to a predetermined thickness. On one surface (i.e., the back surface) of the element layer 201, a color filter 204 and a microlens 205 are disposed, in that order. On the other surface (i.e., the front surface) of the element layer 201, a metal layer 203 is provided.

As described earlier, since the back-illuminated architecture light is configured to capture incident light shining onto the surface opposite that of the metal layer 203 (i.e., the back surface), the wire layout in the metal layer 203 can be designed without making considerations for the light-sensitive surface of the photodiode 202. Since there is a greater degree of freedom in wire layout design, the back-illuminated architecture consequently has the advantage of allowing for easier pixel miniaturization compared to the front-illuminated architecture. Furthermore, the distance between the photodiode 202 and the color filter 204 is extremely short compared to that of the front-illuminated architecture, and thus the focusing of incident light becomes less important. In extreme cases, it is even possible to omit the microlens 205.

It is possible to apply all embodiments of the present invention to a back-illuminated solid state image sensor, with each embodiment exhibiting its specific advantages therein.

(Multi-Pixel Sharing Architecture)

In the present embodiment, the CMOS image sensor 10 as configured above adopts a characteristic multi-pixel sharing architecture, wherein a portion of the component elements typically provided on a per-pixel basis are instead shared among a plurality of pixels in the pixel array 11. Before describing the present embodiment, a pixel configuration that does not adopt a multi-pixel sharing architecture will be described.

<Pixel Circuit Not Adopting a Multi-Pixel Sharing Architecture>

Figure 5:
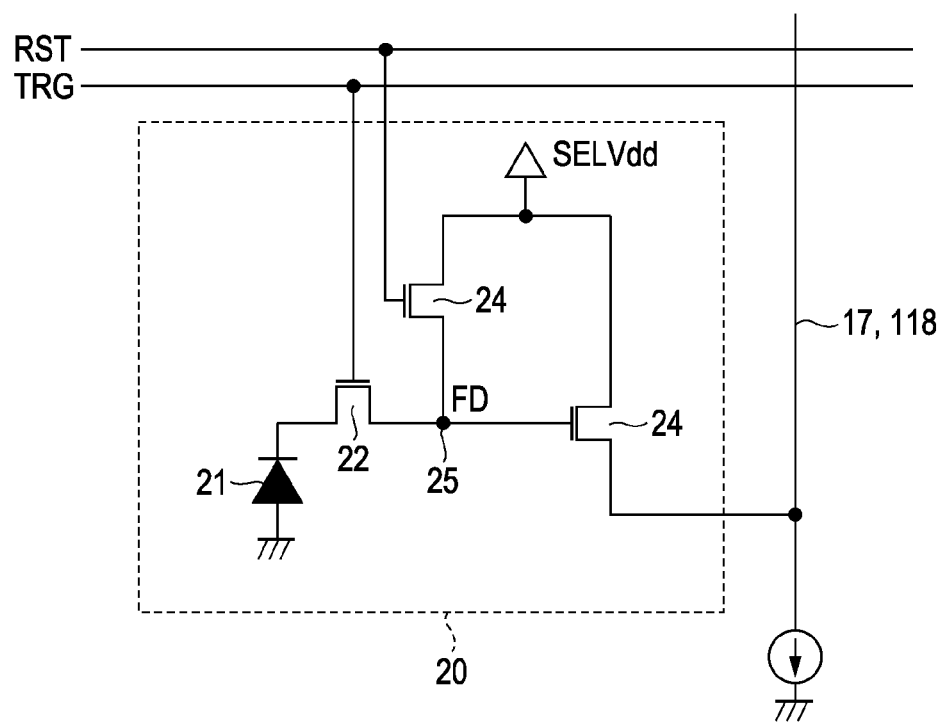
FIG. 5 is a circuit diagram illustrating an exemplary pixel circuit that does not adopt a multi-pixel sharing architecture.

FIG. 5 is a circuit diagram illustrating an exemplary pixel circuit that does not adopt a multi-pixel sharing architecture. As shown in FIG. 5, the pixel 20 in accordance with the exemplary circuit includes a photodetector (such as a photodiode 21, for example), as well as three transistors: a transfer transistor 22, a reset transistor 23, and an amplifier transistor 24. Herein, the transistors 22 to 24 are illustrated using N-channel MOS transistors by way of example.

Herein, the transfer transistor 22 forms a transfer gate that transfers charge that has been photoelectrically converted by the photodiode 21 to a floating diffusion (FD) 25, which acts as a charge-to-voltage converter. The reset transistor 23 forms a reset gate that resets the potential of the FD 25. The amplifier transistor 24 forms an amplifier that outputs a signal corresponding to the potential of the FD 25 to the vertical signal line 17.

In FIG. 5, the anode of the photodiode 21 is grounded. The transfer transistor 22 is connected between the cathode of the photodiode 21 and the FD 25, with a transfer pulse TRG being selectively applied to its gate from the vertical driver 12. When the transfer pulse TRG is applied, the transfer transistor 22 is switched on, and the signal charge (herein, photoelectrons) that has been photoelectrically converted and accumulated by the photodiode 21 is transferred to the FD 25.

The reset transistor 23 is respectively connected to the selecting power supply SELVdd at its drain and the FD 25 at its source, with a reset pulse RST being selectively applied to its gate from the vertical driver 12. The application of the reset pulse RST precedes the charge transfer from the photodiode 21. When the reset pulse RST is applied, the reset transistor 23 is switched on, and the FD 25 is reset by discarding the charge of the FD 25 into the selecting power supply SELVdd. Herein, the selecting power supply SELVdd selectively takes one of two power supply voltages: the Vdd level and a GND level, for example.

The amplifier transistor 24 is configured as a source follower, being respectively connected to the FD 25 at its gate, the selecting power supply SELVdd at its drain, and the vertical signal line 17 at its source. The amplifier transistor 24 becomes operational as a result of the selecting power supply SELVdd switching to the Vdd level, at which point the amplifier transistor 24 outputs a reset level to the vertical signal line 17, in the form of the potential of the FD 25 after being reset by the reset transistor 23. Additionally, the amplifier transistor 24 also outputs a signal level to the vertical signal line 17, in the form of the potential of the FD 25 after receiving a charge transfer by the transfer transistor 22.

Herein, the selecting power supply SELVdd selectively takes one of two power supply voltage levels: GND level (0 V) or a nearby first voltage level (such as 0.6 V, for example); and a Vdd level. By switching from the GND level or first voltage level to the Vdd level, the selecting power supply SELVdd conducts pixel selection.

It is possible to apply all embodiments of the present invention to a solid state image sensor having a pixel circuit that does not adopt a multi-pixel sharing architecture, with each embodiment exhibiting its specific advantages therein.

<Pixel Circuit Adopting a Multi-Pixel Sharing Architecture in Accordance with the Present Embodiment>

Figure 6:
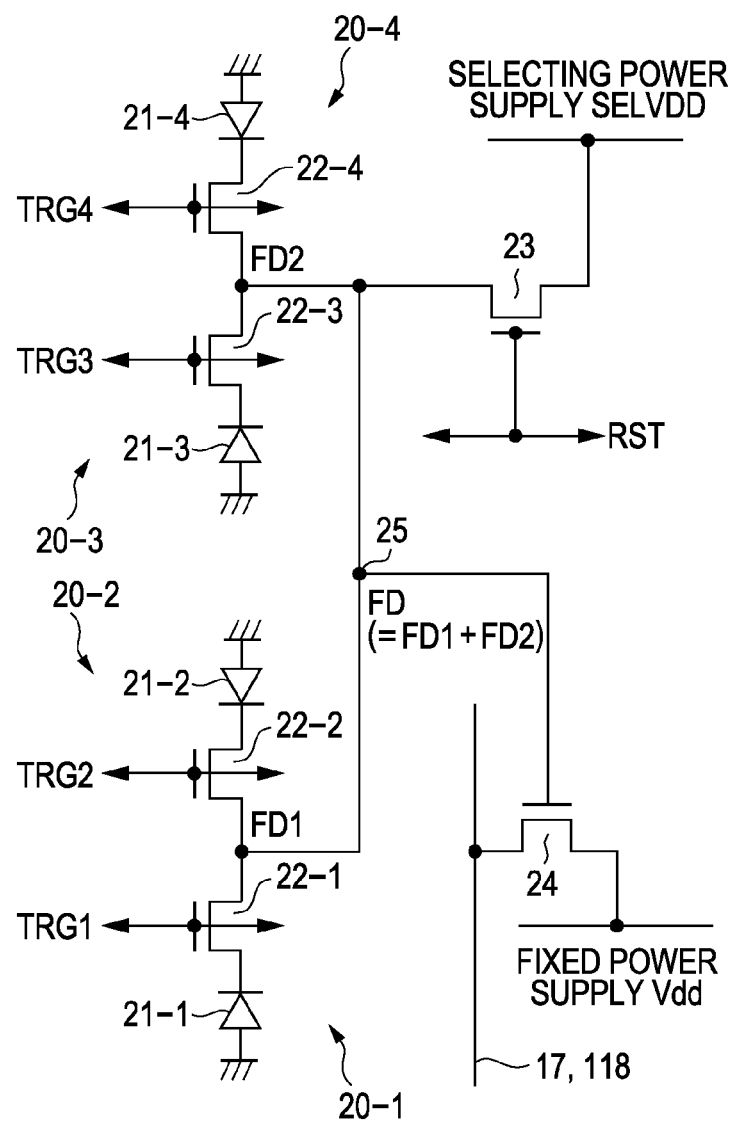
FIG. 6 is a circuit diagram illustrating an exemplary pixel circuit that adopts a multi-pixel sharing architecture in accordance with an embodiment of the present invention.

FIG. 6 is a circuit diagram illustrating an exemplary pixel circuit that adopts a multi-pixel sharing architecture in accordance with an embodiment of the present invention. In FIG. 6, identical reference numbers are used for portions similar to those shown in FIG. 5.

In the pixel circuit in accordance with the present embodiment, a plurality of adjacent pixels, such as the four vertically adjacent pixels 20-1, 20-2, 20-3, and 20-4 belonging to the same pixel column, are treated as a single unit. This unit is configured such that a single FD 25 is shared among the four pixels therein. When sharing components among a plurality of adjacent pixels, sharing on the same pixel column allows for easy timing control for reading out signals from the individual pixels.

The four pixels 20-1, 20-2, 20-3, and 20-4 that form the above unit respectively include photodiodes 21-1, 21-2, 21-3, and 21-4, which act as photodetectors. The four pixels 20-1, 20-2, 20-3, and 20-4 are also grouped into twos (i.e., paired). An amplifier transistor 24 is provided in the pixel region of the two pixels 20-1 and 20-2 forming one group, while a reset transistor 23 is provided in the pixel region of the two pixels 20-3 and 20-4 forming the other group.

In the pixel circuit not adopting a multi-pixel sharing architecture that was described earlier, the reset transistor 23 and the amplifier transistor 24 were both connected to the selecting power supply SELVdd at their respective drains. In other words, a common selecting power supply SELVdd was prepared as the drain power supply for both the reset transistor 23 and the amplifier transistor 24.

In contrast, in the pixel circuit in accordance with the present embodiment, separate power supplies are prepared as the respective drain power supplies for the reset transistor 23 and the amplifier transistor 24. The separate power supplies are a fixed power supply Vdd for which the power supply voltage (i.e., the voltage level) is constant, as well as a selecting power supply SELVDD whose power supply voltage is variable. The selecting power supply SELVDD selectively takes one of two power supply voltage levels: GND level (0 V) or a nearby first voltage level; and a second voltage level VDD that is higher than the voltage level Vdd of the fixed power supply Vdd, for example. By switching from the first voltage level to the second voltage level VDD, the selecting power supply SELVDD conducts pixel selection. The boosted voltage level Vdd+α boosted by the booster circuit 18 as described earlier is used as the second voltage level VDD.

In addition, the drain of the reset transistor 23 is connected to the selecting power supply SELVDD, while the drain of the amplifier transistor 24 is connected to the fixed power supply Vdd. The source of the reset transistor 23 is connected to the FD 25 shared among the four vertical pixels 20-1, 20-2, 20-3, and 20-4. The reset pulse RST is selectively applied to the gate of the reset transistor 23. The gate of the amplifier transistor 24 is connected to the FD 25, while the source is connected to the vertical signal line 17.

<Circuit Operation in the Pixel Circuit in Accordance with the Present Embodiment>

Figure 7:
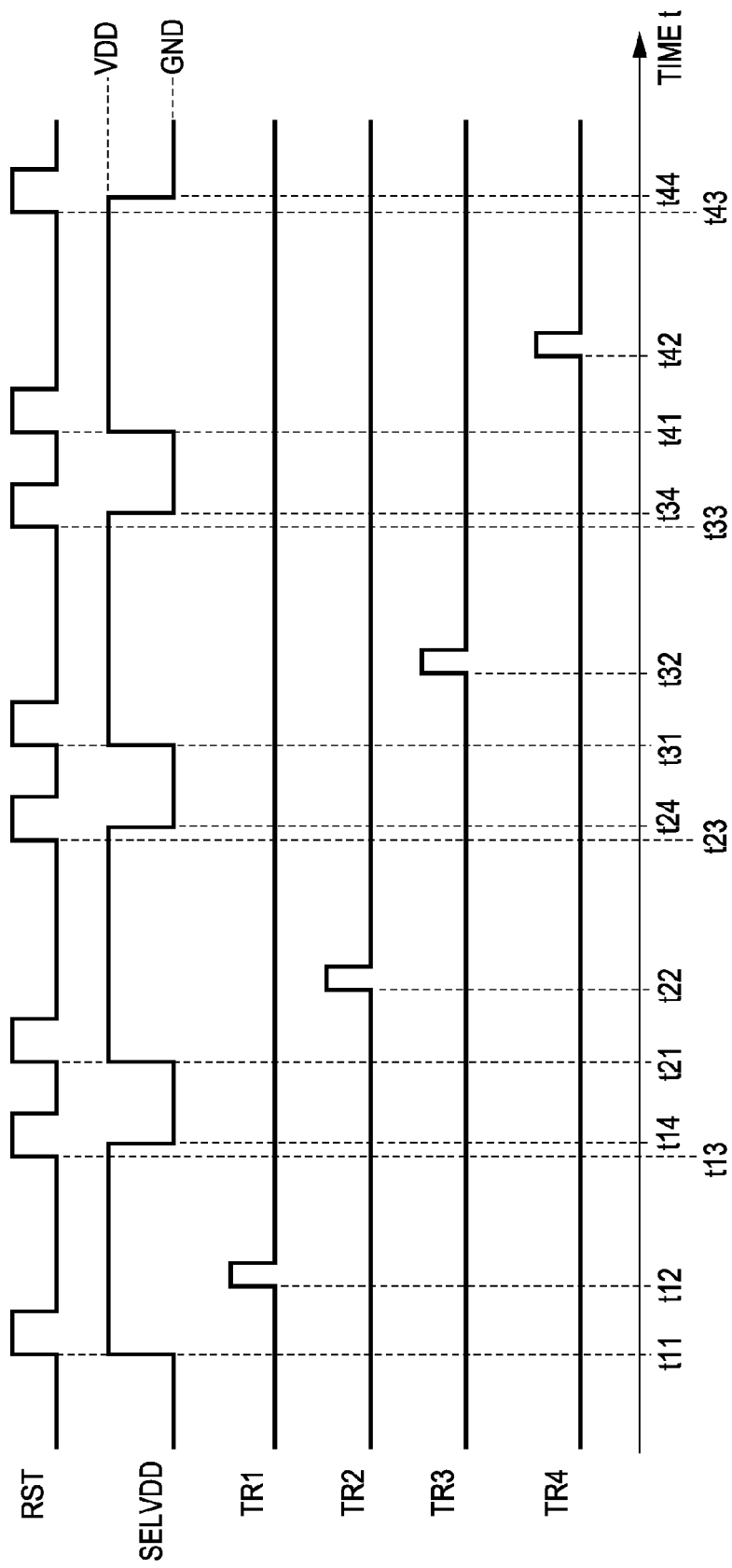
FIG. 7 is a timing chart accompanying an explanation of circuit operation in a pixel circuit in accordance with an embodiment of the present invention.

Circuit operation in a pixel circuit in accordance with an embodiment of the present invention as configured above will now be described using the timing chart shown in FIG. 7.

At the time t11, the selecting power supply SELVDD switches from the first voltage level (GND, for example) to the second voltage level VDD. As a result, the pixels in the first through fourth rows become selected. At the same time, the reset pulse RST becomes active (in the present example, the H level), which causes the reset transistor 23 shared by the four pixels (i.e., the pixels in the first through fourth rows) to be switched on. In so doing, the charge in the FD 25 shared by the four pixels passes through the reset transistor 23 and is discarded into the selecting power supply SELVDD. As a result, the potential of the FD 25 is reset to the second voltage level VDD of the selecting power supply SELVDD. Additionally, the potential of the FD 25 at this point is output to the vertical signal line 17 by the amplifier transistor 24 as the reset level of the first-row pixel 20-1.

Next, after the reset pulse RST has transitioned to an inactive state (in the present example, the L level), at time t12 the first-row transfer pulse TR1 becomes active (in the present example, the H level), which causes the transfer transistor 22-1 of the pixel 20-1 to be switched on. In so doing, the signal charge (i.e., photoelectrons) that has been photoelectrically converted by the photodiode 21-1 is transferred to the FD 25 by the transfer transistor 22-1. At this point, the potential of the FD 25 becomes a potential corresponding to the quantity of charge in the signal charge transferred from the photodiode 21-1. Subsequently, the potential of the FD 25 is output to the vertical signal line 17 by the amplifier transistor 24 as the signal level of the first-row pixel 20-1.

After that, at the time t13, the reset pulse RST becomes active, and at the subsequent time t14, the selecting power supply SELVDD switches from the second voltage level VDD to the first voltage level GND. As a result, the pixels in the first through fourth rows become deselected.

At the time t21, the selecting power supply SELVDD switches from the first voltage level GND to the second voltage level VDD. As a result, the pixels in the first through fourth rows become selected again. At the same time, the reset pulse RST becomes active, which causes the reset transistor 23 shared by the four pixels to be switched on. In so doing, the potential of the FD 25 is reset to the second voltage level VDD of the selecting power supply SELVDD. Additionally, the potential of the FD 25 at this point is output to the vertical signal line 17 by the amplifier transistor 24 as the reset level of the second-row pixel 20-2.

Next, after the reset pulse RST has transitioned to an inactive state, the second-row transfer pulse TR2 becomes active at the time t22, which causes the transfer transistor 22-2 of the pixel 20-2 to be switched on. In so doing, the signal charge that has been photoelectrically converted by the photodiode 21-2 is transferred to the FD 25 by the transfer transistor 22-2. At this point, the potential of the FD 25 is also output to the vertical signal line 17 by the amplifier transistor 24 as the signal level of the second-row pixel 20-2.

After that, at the time t23, the reset pulse RST becomes active, and at the subsequent time t24, the selecting power supply SELVDD switches from the second voltage level VDD to the first voltage level GND. As a result, the pixels in the first through fourth rows become deselected.

At the time t31, the selecting power supply SELVDD switches from the first voltage level GND to the second voltage level VDD. As a result, the pixels in the first through fourth rows become selected again. At the same time, the reset pulse RST becomes active, which causes the reset transistor 23 shared by the four pixels to be switched on. In so doing, the potential of the FD 25 is reset to the second voltage level VDD of the selecting power supply SELVDD. Additionally, the potential of the FD 25 at this point is output to the vertical signal line 17 by the amplifier transistor 24 as the reset level of the third-row pixel 20-3.

Next, after the reset pulse RST has transitioned to an inactive state, the third-row transfer pulse TR3 becomes active at the time t32, which causes the transfer transistor 22-3 of the pixel 20-3 to be switched on. In so doing, the signal charge that has been photoelectrically converted by the photodiode 21-3 is transferred to the FD 25 by the transfer transistor 22-3. At this point, the potential of the FD 25 is also output to the vertical signal line 17 by the amplifier transistor 24 as the signal level of the third-row pixel 20-3.

After that, at the time t33, the reset pulse RST becomes active, and at the subsequent time t34, the selecting power supply SELVDD switches from the second voltage level VDD to the first voltage level GND. As a result, the pixels in the first through fourth rows become deselected.

At the time t41, the selecting power supply SELVDD switches from the first voltage level GND to the second voltage level VDD. As a result, the pixels in the first through fourth rows become selected again. At the same time, the reset pulse RST becomes active, which causes the reset transistor 23 shared by the four pixels to be switched on. In so doing, the potential of the FD 25 is reset to the second voltage level VDD of the selecting power supply SELVDD. Additionally, the potential of the FD 25 at this point is output to the vertical signal line 17 by the amplifier transistor 24 as the reset level of the fourth-row pixel 20-4.

Next, after the reset pulse RST has transitioned to an inactive state, the fourth-row transfer pulse TR4 becomes active at the time t42, which causes the transfer transistor 22-4 of the pixel 20-4 to be switched on. In so doing, the signal charge that has been photoelectrically converted by the photodiode 21-4 is transferred to the FD 25 by the transfer transistor 22-4. At this point, the potential of the FD 25 is also output to the vertical signal line 17 by the amplifier transistor 24 as the signal level of the fourth-row pixel 20-4.

After that, at the time t43, the reset pulse RST becomes active, and at the subsequent time t44, the selecting power supply SELVDD switches from the second voltage level VDD to the first voltage level GND. As a result, the pixels in the first through fourth rows become deselected. Thereafter, the above series of circuit operations treating four rows as a unit is repeated for all pixel rows.

As described above, in the pixel circuit in accordance with the present embodiment, the respective drain power supplies of the reset transistor 23 and the amplifier transistor 24 are made to be separate power supplies, with the high (H) voltage level VDD of the selecting power supply SELVDD set higher than the voltage level Vdd of the fixed power supply Vdd. More specifically, the voltage level VDD used to reset the FD 25 is set higher than the voltage level Vdd of the fixed power supply Vdd by a predetermined value α (VDD=Vdd+α).

In so doing, the potential of the FD 25 at reset is made deeper than that of the case when the reset voltage of the FD 25 is set to Vdd, having been increased by an amount corresponding to the predetermined value α. If the potential of the FD 25 at reset can be made deep, then the potential of the photodiodes 21 can be designed to be deep to an equivalent degree. As a result, the quantity of charge handled by the photodiodes 21 (i.e., the quantity of charge that can be accumulated) can be increased beyond that of the case when the reset level of the FD 25 is the Vdd level.

Having miniaturized the pixels 20 by implementing a multi-pixel sharing architecture, if further pixel miniaturization entailed by increased pixel resolutions is to be considered in order to meet the demand for more detailed images, then it is desirable to reduce the footprint of the photodiodes 21 to match the size reduction in the pixel footprint. However, it becomes difficult to obtain sufficient saturation characteristics if the footprint of the photodiodes 21 is reduced, since the quantity of charge handled by each photodiode 21 is decreased as a result.

In contrast, in the pixel circuit in accordance with the present embodiment, the reset voltage of the FD 25 is set higher than the Vdd level, and the potential of the FD 25 at reset is thus deepened. In so doing, the quantity of charge handled by the photodiodes 21 is increased. As a result, the quantity of charge handled by the photodiodes 21 can be increased even when the footprint of the photodiodes 21 is reduced due to miniaturization in pixel area. For this reason, saturation characteristics can be obtained that are higher than those of the case when the reset voltage is the Vdd level.

The reason for providing separate power supplies as the respective drain power supplies for the reset transistor 23 and the amplifier transistor 24 in the pixel circuit in accordance with the present embodiment will now be described.

When integrating peripheral circuits, including the vertical driver 12, onto the same chip (i.e., semiconductor substrate) as the pixel array 11, the various power supply voltages used by the peripheral circuits are typically input from outside the chip. At this point, if the new voltage level VDD that differs from the voltage level Vdd is to be input from off-chip, then an additional terminal pin is added for that purpose. However, if it is undesirable to add more terminal pins, then a method may be adopted wherein a booster circuit is provided on-chip, and the voltage level Vdd is boosted to the voltage level VDD by the booster circuit. When forming a booster circuit on-chip, it is typical to use a charge pump circuit as the booster circuit.

Herein, if it is assumed that the same selecting power supply SELVDD is used as the respective drain power supply for both the reset transistor 23 and the amplifier transistor 24, then the current that flows into the amplifier transistor 24 is larger than that of case when the selecting power supply SELVdd shown in FIG. 5 is used. A large current therefore also flows into the charge pump circuit that generates the selecting power supply SELVDD. Typically, however, it is not feasible for large currents to flow into a charge pump circuit. Consequently, when adopting a system configuration wherein a booster circuit made up of a charge pump circuit is integrated on-chip, separate power supplies are provided as the respective drain power supplies for the reset transistor 23 and the amplifier transistor 24 in order to prevent large currents from flowing into the charge pump circuit.

In the foregoing example, the plurality of pixels treated as a unit are taken to be four adjacent pixels 20-1 to 20-4 belonging to the same pixel column. Furthermore, the pixels 20-1 to 20-4 are grouped into twos. In one group, the amplifier transistor 24 is shared between the two pixels 20-1 and 20-2, while in the other group, the reset transistor 23 is shared between the two pixels 20-3 and 20-4. It should be appreciated that the foregoing is merely one example. However, sharing on the same pixel column does allow for easy timing control for reading out signals from individual pixels.

The embodiments of the present invention to be hereinafter described may be applied to a solid state image sensor that performs the circuit operations of the above pixel circuit, with each embodiment exhibiting its specific advantages therein.

<Layout of Pixel Circuit in Accordance with the Present Embodiment>

The layout of a pixel circuit adopting a multi-pixel sharing architecture in accordance with the present embodiment will now be described.

Figure 8:
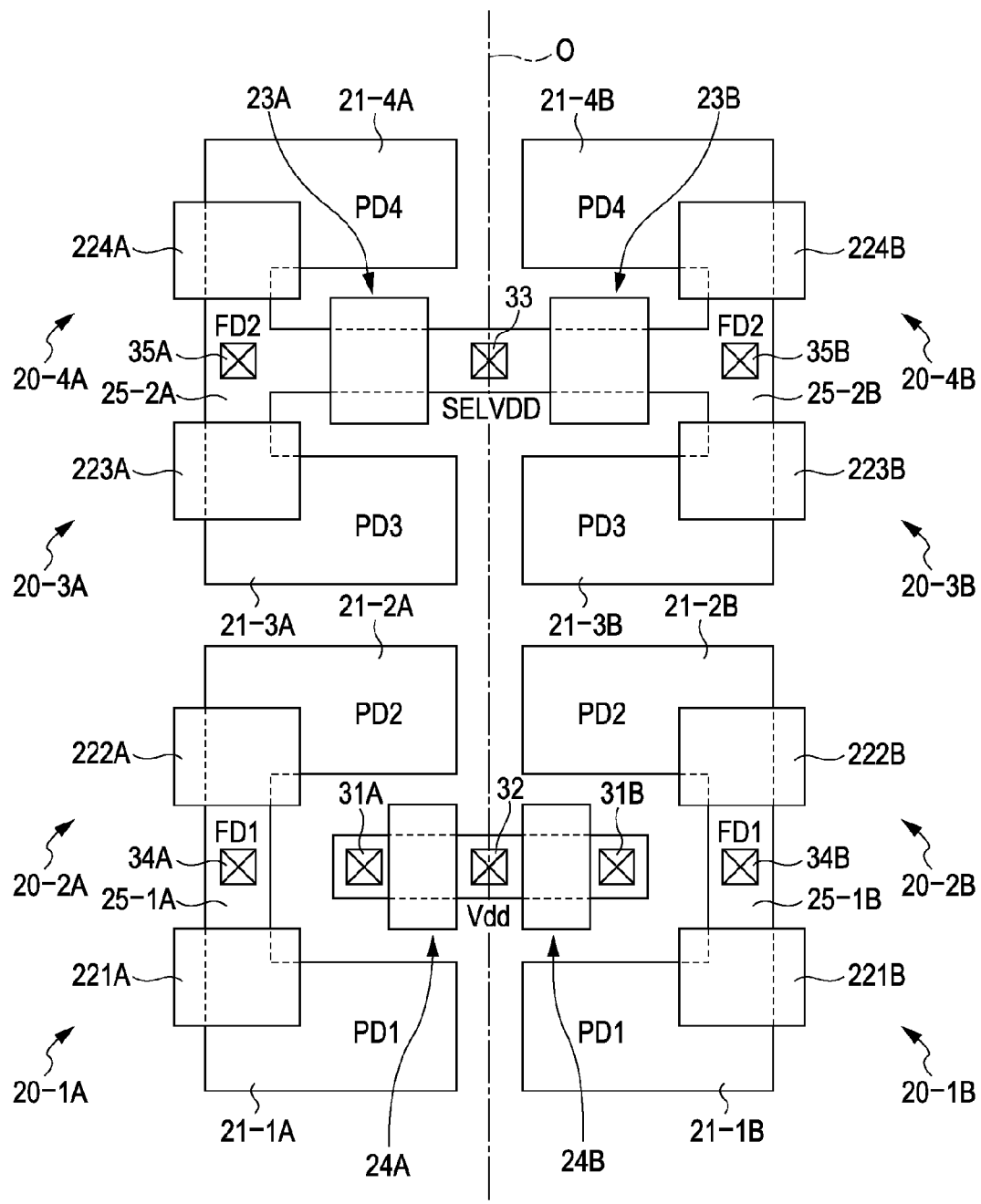
FIG. 8 is a planar pattern diagram illustrating an exemplary layout of a pixel circuit in accordance with an embodiment of the present invention.

FIG. 8 is a planar pattern diagram illustrating an exemplary layout of the pixel circuit in accordance with the present embodiment. FIG. 8 illustrates the layout of a total of eight pixels in two pixel columns A and B, in the case where four vertical pixels are treated as a single unit.

First, the layout of the four pixels 20-1A, 20-2A, 20-3A, and 20-4A in the pixel column A will be described.

In the first group, the photodiode 21-1A of the pixel 20-1A and the photodiode 21-2A of the pixel 20-2A are formed separated by a predetermined interval. An FD 25-1A is also formed between the photodiodes 21-1A and 21-2A, on the left side, for example. In addition, the gate 221A of a transfer transistor 22-1A is disposed between the photodiode 21-1A and the FD 25-1A. Likewise, the gate 222A of a transfer transistor 22-2A is disposed between the photodiode 21-2A and the FD 25-1A.

An amplifier transistor 24A is formed on the right side of the center portion between the photodiodes 21-1A and 21-2A. The source region of the amplifier transistor 24A is electrically connected to the vertical signal line 17 via a contact portion 31A. The drain region of the amplifier transistor 24A is electrically connected to the fixed power supply Vdd via a contact portion 32.

In the second group, the photodiode 21-3A of the pixel 20-3A and the photodiode 21-4A of the pixel 20-4A are formed separated by a predetermined interval. An FD 25-2A is also formed between the photodiodes 21-3A and 21-4A, on the left side, for example. In addition, the gate 223A of a transfer transistor 22-3A is disposed between the photodiode 21-3A and the FD 25-2A. Likewise, the gate 224A of a transfer transistor 22-4A is disposed between the photodiode 21-4A and the FD 25-2A.

A reset transistor 23A is formed between the photodiodes 21-3A and 21-4A. The source region of the reset transistor 23A is integrally formed with the FD 25-2A. The drain region of the reset transistor 23A is electrically connected to the selecting power supply SELVDD via a contact portion 33.

In the pixels 20-1A and 20-2A of the first group, the FD 25-1A is electrically connected to a lead (not shown) in a separate layer by a contact portion 34A. Likewise, in the pixels 20-3A and 20-4A of the second group, the FD 25-2A is electrically connected to the same lead by a contract portion 35A. In other words, the FD 25-1A and the FD 25-2A are electrically connected to each other via the above lead.

Next, the layout of the four pixels 20-1B, 20-2B, 20-3B, and 20-4B in the pixel column B adjacent to the pixel column A will be described.

In the first group, the photodiode 21-1B of the pixel 20-1B and the photodiode 21-2B of the pixel 20-2B are formed separated by a predetermined interval. An FD 25-1B is also formed between the photodiodes 21-1B and 21-2B, on the right side, for example. In addition, the gate 221B of a transfer transistor 22-1B is disposed between the photodiode 21-1B and the FD 25-1B. Likewise, the gate 222B of a transfer transistor 22-2B is disposed between the photodiode 21-2B and the FD 25-1B.

An amplifier transistor 24B is formed on the left side of the center portion between the photodiodes 21-1B and 21-2B. The source region of the amplifier transistor 24B is electrically connected to the vertical signal line 17 via a contact portion 31B. The drain region of the amplifier transistor 24B is integrally formed with the drain region of the amplifier transistor 24A. Consequently, the drain region of the amplifier transistor 24B is also electrically connected to the fixed power supply Vdd via the contact portion 32.

In the second group, the photodiode 21-3B of the pixel 20-3B and the photodiode 21-4B of the pixel 20-4B are formed separated by a predetermined interval. An FD 25-2B is also formed between the photodiodes 21-3B and 21-4B, on the right side, for example. In addition, the gate 223B of a transfer transistor 22-3B is disposed between the photodiode 21-3B and the FD 25-2B. Likewise, the gate 224B of a transfer transistor 22-4B is disposed between the photodiode 21-4B and the FD 25-2B.

A reset transistor 23B is formed between the photodiodes 21-3B and 21-4B. The source region of the reset transistor 23B is integrally formed with the FD 25-2B. The drain region of the reset transistor 23B is integrally formed with the drain region of the reset transistor 23A. Consequently, the drain region of the reset transistor 23B is also electrically connected to the selecting power supply SELVDD via the contact portion 33.

In the pixels 20-1B and 20-2B of the first group, the FD 25-1B is electrically connected to a lead (not shown) in a separate layer by a contact portion 34B. Likewise, in the pixels 20-3B and 20-4B of the second group, the FD 25-2B is electrically connected to the same lead by a contract portion 35B. In other words, the FD 25-1B and the FD 25-2B are electrically connected to each other via the above lead.

In the layout of the pixel circuit configured above, one FD is provided to each group of two pixels, with the single FD regions (i.e., FDs) being shared between two pixels. More specifically, the FD 25-1A is shared between the pixels 20-1A and 20-2A, and the FD 25-2A is shared between the pixels 20-3A and 20-4A. Likewise, the FD 25-1B is shared between the pixels 20-1B and 20-2B, and the FD 25-2B is shared between the pixels 20-3B and 20-4B.

Furthermore, the layout is such that either a reset transistor 23 or a amplifier transistor 24 is provided between the two pixels in each group. In other words, the pixel circuit in accordance with the present embodiment is based on a configuration wherein a single pixel includes the three transistors (Tr) 22, 23, and 24 (see FIG. 5). However, whereas the pixel shown in FIG. 5 has a 3 Tr configuration, a single pixel in the pixel circuit in accordance with the present embodiment has a 1.5 Tr configuration. Moreover, FIG. 8 in particular demonstrates how the four-pixel unit in the pixel column A and the four-pixel unit in the pixel column B are symmetrically disposed with respect to the boundary line between the pixel columns A and B. In other words, the layout is such that the respective groups are disposed facing each other.

In other words, the layout in accordance with the present embodiment is first of all configured such that an FD region is shared between the two pixels in each group, and also such that either a reset transistor 23 or a amplifier transistor 24 is provided between the two pixels. This layout is efficient for securing the area occupied by the photodiodes 21. Furthermore, the layout in accordance with the present embodiment is configured such that every two pixels are disposed facing each other across pixel columns. By adopting this layout, both the contact portion 32 of the fixed power supply Vdd as well as the contact portion 33 of the selecting power supply SELVDD can be shared between the two pixel columns A and B. For this reason, the efficiency of the layout is further improved.

As described above, since the layout in accordance with the present embodiment is efficient, it is possible to secure a large footprint for the photodiodes 21, even when adopting a multi-pixel sharing architecture and attempting further miniaturization in order to meet the demand for more detailed images. Particularly, when the present layout is applied to a back-illuminated architecture (see FIG. 4B) described earlier, the light-sensitive area of the photodiodes 21 can be maximized in a limited pixel area, since there exists no metal layer on the side where incident light is captured. Consequently, the quantity of charge handled by the photodiodes 21 can be increased compared to the case when the layout in accordance with the present embodiment is not adopted, and thus high saturation characteristics can be obtained.

The embodiments of the present invention to be hereinafter described may be applied to a solid state image sensor having the layout of the above pixel circuit, with each embodiment exhibiting its specific advantages therein.

[Modifications]

The foregoing describes the example of applying an embodiment of the present invention to a CMOS image sensor having an array of unit pixels arranged therein, and wherein the physical quantity detected by each unit pixel is a signal charge corresponding to the intensity of visible light. However, it should be appreciated that the present invention is not limited in application to CMOS image sensors, and may also be applied to general solid state imaging apparatus wherein pixel miniaturization is attempted by adopting a multi-pixel sharing architecture.

Furthermore, the present invention is not limited to solid state imaging apparatus that scan individual pixels in the pixel array by rows, and then read signals from the individual pixels on the selected row. Rather, the present invention may also be applied to X-Y addressing solid state imaging apparatus that select arbitrary pixels on a per-pixel basis, and then read signals on a per-pixel basis from the selected pixels.

Such a solid state imaging apparatus may be formed as a single-chip solution, or as a module having packaged imaging functions and containing an imager as well as either a signal processor or optics.

Furthermore, the present invention is not limited in application to solid state imaging apparatus, and may also be applied to other types of imaging apparatus. Such other types of imaging apparatus may refer to camera systems, such as digital still and video cameras, as well as to electronic devices having imaging functions, such as mobile phones. In some cases, the imaging apparatus may be provided in module form and incorporated into such an electronic device. In other words, the imaging apparatus may be a camera module.

All embodiments of the present invention to be hereinafter described may be applied to an imaging apparatus configured in accordance with the above modifications, with each embodiment exhibiting its specific advantages therein.

[Imaging Apparatus]

Figure 9:
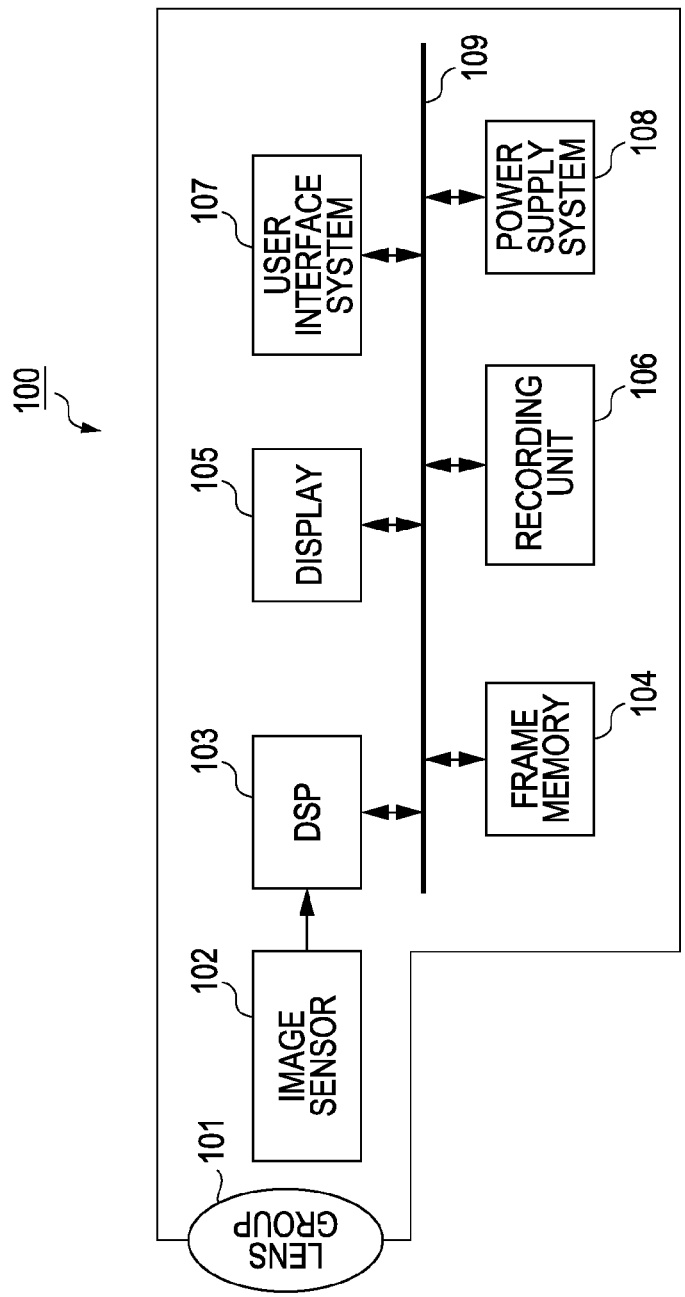
FIG. 9 is a block diagram illustrating an exemplary configuration of an imaging apparatus in accordance with an embodiment of the present invention.

FIG. 9 is a block diagram illustrating an exemplary configuration of an imaging apparatus in accordance with an embodiment of the present invention. As shown in FIG. 9, the imaging apparatus 100 in accordance with an embodiment of the present invention includes: optics, including components such as a lens group 101; an image sensor 102, a DSP circuit 103 that acts as a camera signal processing circuit; frame memory 104; a display 105; a recording unit 106; a user interface system 107; and a power supply system 108, for example. The DSP circuit 103, the frame memory 104, the display 105, the recording unit 106, the user interface system 107, and the power supply system 108 are connected to each other via a bus line 109.

The lens group 101 captures incident light from the subject (i.e., image light) and focuses the captured light onto the photodetector surface of the image sensor 102. The image sensor 102 converts the intensity of the incident light focused onto its photodetector surface by the lens group 101 into electrical signals in units of pixels, and then outputs the result as pixel signals. The CMOS image sensor in accordance with the foregoing embodiment may be used as the image sensor 102 herein.

The display 105 is made up of a panel-type display apparatus, such as a liquid-crystal display (LCD) or organic electro luminescent (organic EL) display. The display 105 displays video or still images acquired by the image sensor 102. The recording unit 106 records video or still images acquired by the image sensor 102 onto a recording medium, such as a video tape or a DVD (Digital Versatile Disc).

On the basis of operations made by the user, the user interface system 107 issues operational instructions for various functions of the imaging apparatus. The power supply system 108 appropriately supplies power to the various power supplies that act as the operative power supplies for the DSP circuit 103, the frame memory 104, the display 105, the recording unit 106, and the user interface system 107.

All embodiments of the present invention to be hereinafter described may be applied to the above imaging apparatus, with each embodiment exhibiting its specific advantages therein.

[Second embodiment]

Hereinafter, a second embodiment of the present invention that uses the foregoing pixel array will be described in detail and with reference to the accompanying drawings. The description will proceed as follows.

1. Solid state image sensor to which the second embodiment is applied (CMOS image sensor example)
2. Back-illuminated pixel architecture
3. Multi-pixel sharing architecture (four-pixel sharing example)
4. Problems when adopting a multi-pixel sharing architecture in a back-illuminated pixel architecture
5. Characteristics of the present embodiment
6. Electronic device (imaging apparatus example)
7. Pixel unit example <1. Solid State Image Sensor to which the Second Embodiment is Applied>

(System Configuration)

Figure 10:
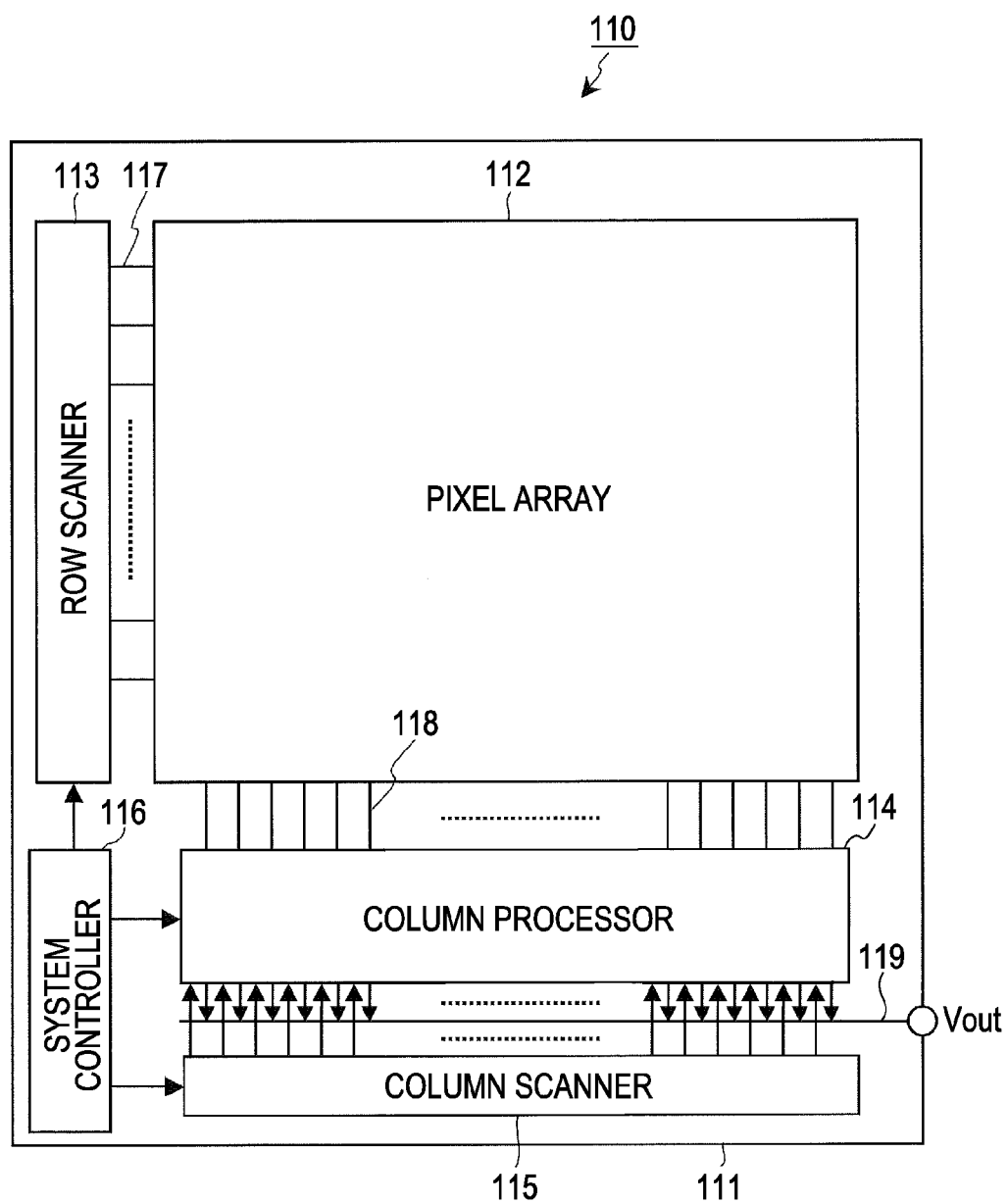
FIG. 10 is a system diagram summarizing the system configuration of a CMOS image sensor to which an embodiment of the present invention has been applied.

FIG. 10 is a system diagram summarizing the system configuration of a CMOS image sensor (a type of X-Y addressing solid state image sensor) to which an embodiment of the present invention has been applied. Herein, a CMOS image sensor refers to an image sensor created by the application or partial use of CMOS processes.

The CMOS image sensor 110 in accordance with the present application example is configured having a pixel array 112 formed on a semiconductor substrate (hereinafter also referred to as a chip) 111, as well as peripheral circuits integrated onto the same chip 111 as the pixel array 112. In the present example, the provided peripheral circuits include a row scanner (i.e., vertical driver) 113, a column processor 114, a column scanner (i.e., horizontal driver) 115, and a system controller 116.

In the pixel array 112, unit pixels (hereinafter also simply referred to as pixels) are arranged in a two-dimensional array. Each unit pixel contains a photodetector that produces, and internally accumulates, a photoelectric charge whose quantity corresponds to the incident light intensity. A more specific configuration of the unit pixels will be given later.

Additionally, pixel drive lines 117 are formed in the pixel array 112 with respect to each pixel row, and extending in the horizontal/row direction (i.e., the direction in which pixels are arranged into rows). Vertical signal lines 118 are likewise formed with respect to each column, and extending in the vertical/column direction (i.e., the direction in which pixels are arranged into columns). The pixel drive lines 117 transmit drive signals that drive the reading of signals from the pixels. Although just one line is shown in FIG. 10, the number of pixel drive lines 117 is not limited to one. One end of each pixel drive line 117 is connected to a per-row output terminal in the row scanner 113.

The row scanner 113 may be realized by means of components such as a shift register or an address decoder. The row scanner 113 is a pixel driver that drives all pixels in the pixel array 112 simultaneously, or on a per-row basis. Although the specific configuration is omitted from illustration herein, the row scanner 113 is typically configured to include two scan subsystems: a readout scan subsystem and a reset scan subsystem.

The readout scan subsystem selectively scans unit pixels in the pixel array 112 in order by rows to read out signals therefrom. The signals read out from the unit pixels are analog signals. The reset scan subsystem conducts a reset scan with respect to a readout row to be scanned by the readout scan subsystem. The reset scan precedes the readout scan by an amount of time equal to the shutter speed.

By means of a reset scan conducted by the reset scan subsystem, unwanted charge is discharged from the photodetectors of the unit pixels on the readout row, thereby resetting the photodetectors. By resetting (i.e., discharging) unwanted charge by means of the reset scan subsystem, an electronic shutter operation is conducted. Herein, an electronic shutter operation refers to an operation whereby photoelectric charge in the photodetectors is discarded and a new exposure is initiated (i.e., the accumulation of photoelectric charge is initiated).

The signals read out by the readout operation of the readout scan subsystem correspond to the intensity of light incident since the last readout operation or electronic shutter operation. The period of time starting at either the readout timing of the last readout operation or the reset timing of the last electronic shutter operation, and ending at the readout timing of the current readout operation, becomes the photoelectric charge accumulation time (i.e., the exposure time) for the unit pixels.

The signals output from respective unit pixels on the pixel row selectively scanned by the row scanner 113 are supplied to the column processor 114 via individual vertical signal lines 118. For each pixel column of the pixel array 112, the column processor 114 conducts predetermined signal processing with respect to the signals respectively output from the individual pixels on the selected row via the vertical signal lines 118. Additionally, the column processor 114 also temporarily stores the processed pixel signals.

More specifically, the signal processing applied to received unit pixel signals by the column processor 114 may include noise removal by means of correlated double sampling (CDS), signal amplification, and analog-to-digital (AD) conversion, for example. Noise removal processing is used to remove pixel-specific, fixed-pattern noise, such as reset noise and threshold value variation in the amplifier transistors. It should be appreciated that the signal processing described by way of example herein are merely examples, and that the signal processing is not limited to the above.

The column scanner 115 may be realized by means of components such as a shift register or an address decoder, and sequentially selects unit circuits corresponding to pixel columns in the column processor 114. As a result of the select scans performed by the column scanner 115, pixel signals processed by the column processor 114 are output in sequential order to a horizontal bus 119, and then transmitted off the chip 111 via the horizontal bus 119.

The system controller 116 receives clocks and data stipulating the operational mode that are provided from off the chip 111, while also outputting data and other internal information of the CMOS image sensor 110. The system controller 116 also includes a timing generator that generates various timing signals. On the basis of the various timing signals generated by the timing generator, the system controller 116 controls the driving of peripheral circuits such as the row scanner 113, the column processor 114, and the column scanner 115.

The configuration of the CMOS image sensor 110 described above is fundamentally the same for both front-illuminated and back-illuminated pixel architectures. However, a CMOS image sensor in accordance with an embodiment of the present invention is presumed to adopt a back-illuminated pixel architecture. Hereinafter, a specific configuration of a back-illuminated pixel architecture will be described.

<2. Back-Illuminated Pixel Architecture>

Figure 11:
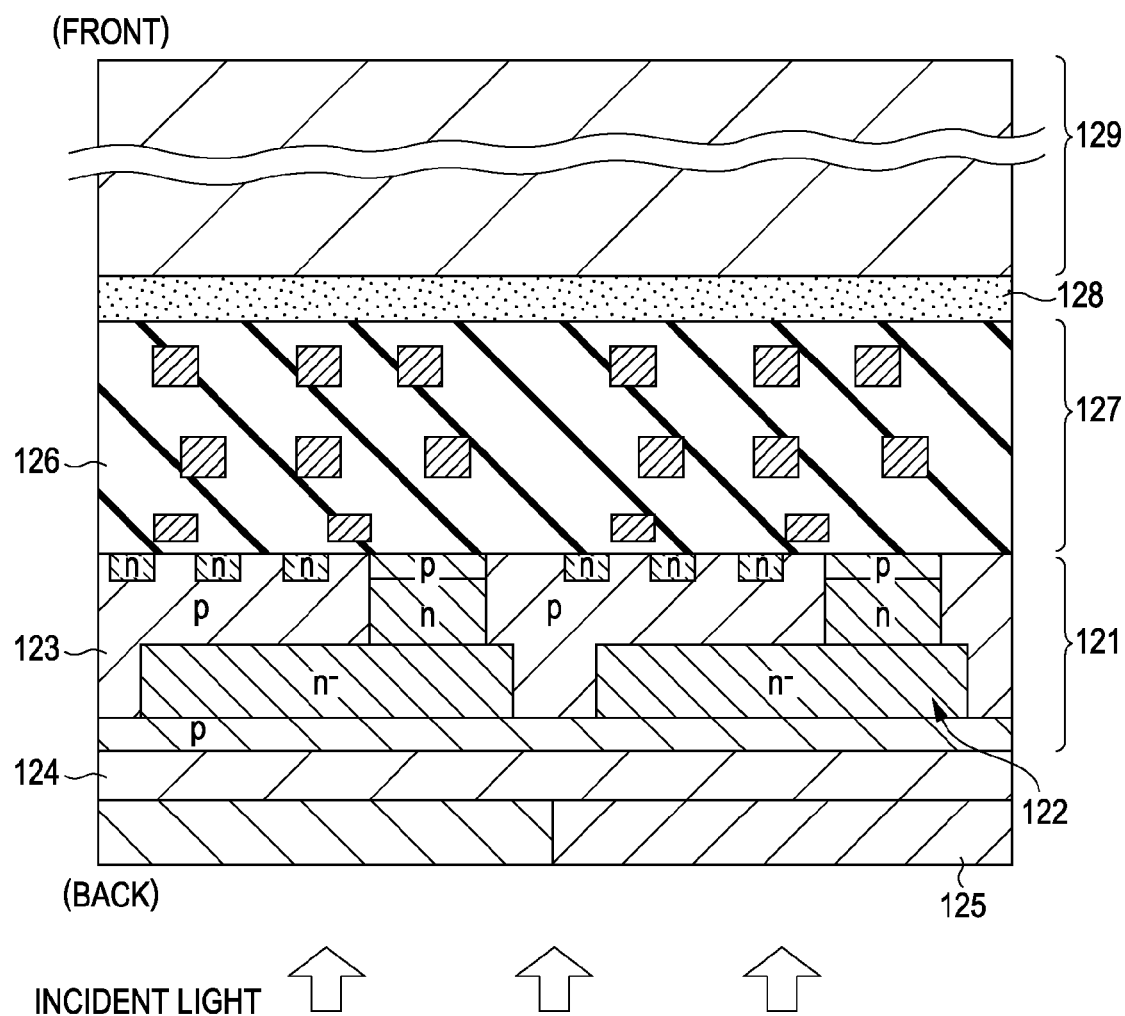
FIG. 11 is a cross-section illustrating an exemplary configuration of a back-illuminated pixel architecture.

FIG. 11 is a cross-section illustrating an exemplary configuration of a back-illuminated pixel architecture. In FIG. 11, the cross-sectional architecture for two pixels is illustrated.

In FIG. 11, a photodiode 122 that acts as a photodetector, as well as a pixel transistor 123 that drives the photodiode 122, are formed in a silicon portion 121. In other words, the silicon portion 121 is the element-forming portion.

A color filter 25 is incorporated onto one surface of the silicon portion 121 via an interlayer film 124. In so doing, light incident onto the one surface of the silicon portion 121 is guided through the color filter 125 and onto the light-sensitive surface of the photodiode 122.

Meanwhile, a metal layer 127 is formed on the other surface of the silicon portion 121. The metal layer 127 itself is multi-layered, containing the gate of the pixel transistor 123 and other metal components inside an interlayer insulating film. On the side of the metal layer 127 opposite that of the silicon portion 121, a support substrate 129 is affixed by means of adhesive 128.

In the above pixel architecture, the surface of the silicon portion 121 on the side of the metal layer 127 is referred to as the front, while the surface of the silicon portion 121 opposite that of the metal layer 127 is referred to as the back. Given such definitions, the present pixel architecture is a back-illuminated pixel architecture, since incident light shining onto the back of the silicon portion 121 is captured.

According to this back-illuminated pixel architecture, incident light can be captured on the surface opposite the metal layer 127 (i.e., the back) without designing the layout of the components in the metal layer 127 with consideration for the light-sensitive surface of the photodiode 122. Since there is a greater degree of freedom in wire layout design, the back-illuminated architecture consequently has the advantage of allowing for easier pixel miniaturization compared to the front-illuminated architecture.

Furthermore, the distance between the photodiode 122 and the color filter 125 is extremely short compared to that of the front-illuminated architecture. Thus, while a microlens (i.e., an on-chip lens) is usually provided in back-illuminated pixel architectures, it is conceivable to omit the microlens in one embodiment.

<3. Multi-Pixel Sharing Architecture>

The CMOS image sensor 110 thus adopts a back-illuminated pixel architecture as configured above. In the present embodiment, the CMOS image sensor 110 furthermore adopts a multi-pixel sharing architecture, wherein a portion of the component elements typically provided on a per-pixel basis are instead shared among a plurality of pixels. Before describing the present embodiment, a pixel configuration that does not adopt a multi-pixel sharing architecture will be described.

(Pixel Circuit not Adopting a Multi-Pixel Sharing Architecture)

FIG. 5 is a circuit diagram illustrating an exemplary pixel circuit that does not adopt a multi-pixel sharing architecture. As shown in FIG. 5, the pixel 20 in accordance with the exemplary circuit includes a photodetector (such as a photodiode 21, for example), as well as three transistors: a transfer transistor 22, a reset transistor 23, and an amplifier transistor 24. Herein, the transistors 22 to 24 are illustrated using N-channel MOS transistors by way of example.

Herein, the transfer transistor 22 forms a transfer gate that transfers charge that has been photoelectrically converted by the photodiode 21 to a floating diffusion (FD) 25, which acts as a charge-to-voltage converter. The reset transistor 23 forms a reset gate that resets the potential of the FD 25. The amplifier transistor 24 forms an amplifier that outputs a signal corresponding to the potential of the FD 25 to the vertical signal line 118.

In FIG. 5, the anode of the photodiode 21 is grounded. The transfer transistor 22 is connected between the cathode of the photodiode 21 and the FD 25, with a transfer pulse TRG being selectively applied to its gate from the row scanner 113. When the transfer pulse TRG is applied, the transfer transistor 22 is switched on, and the signal charge (herein, photoelectrons) that has been photoelectrically converted and accumulated by the photodiode 21 is transferred to the FD 25.

The reset transistor 23 is respectively connected to the selecting power supply SELVdd at its drain and the FD 25 at its source, with a reset pulse RST being selectively applied to its gate from the row scanner 113. The application of the reset pulse RST precedes the charge transfer from the photodiode 21. When the reset pulse RST is applied, the reset transistor 23 is switched on, and the FD 25 is reset by discarding the charge of the FD 25 into the selecting power supply SELVdd. Herein, the selecting power supply SELVdd selectively takes one of two power supply voltages: the Vdd level and a GND level, for example.

The amplifier transistor 24 is configured as a source follower, being respectively connected to the FD 25 at its gate, the selecting power supply SELVdd at its drain, and the vertical signal line 118 at its source. The amplifier transistor 24 becomes operational as a result of the selecting power supply SELVdd switching to the Vdd level, at which point the amplifier transistor 24 outputs a reset level to the vertical signal line 118, in the form of the potential of the FD 25 after being reset by the reset transistor 23. Additionally, the amplifier transistor 24 also outputs a signal level to the vertical signal line 118, in the form of the potential of the FD 25 after receiving a charge transfer by the transfer transistor 22.

Herein, the selecting power supply SELVdd selectively takes one of two power supply voltage levels: GND level (0 V) or a nearby first voltage level (such as 0.6 V, for example); and a Vdd level. By switching from the GND level or first voltage level to the Vdd level, the selecting power supply SELVdd conducts pixel selection.

(Pixel Circuit Adopting a Multi-Pixel Sharing Architecture in Accordance with the Present Embodiment)

FIG. 6 is a circuit diagram illustrating an exemplary pixel circuit that adopts a multi-pixel sharing architecture in accordance with an embodiment of the present invention. In FIG. 6, identical reference numbers are used for portions similar to those shown in FIG. 5. Herein, a four-pixel sharing architecture is described by way of example, wherein, among the component elements typically provided on a per-pixel basis, at least the FD 25 (i.e., the charge-to-voltage converter) is shared among a plurality of nearby pixels. For example, the FD 25 may be shared among four vertically adjacent pixels belonging to the same pixel column.

In the pixel circuit adopting a four-pixel sharing architecture, a plurality of adjacent pixels, such as the four vertically adjacent pixels 20-1, 20-2, 20-3, and 20-4 belonging to the same pixel column, are treated as a single unit. This unit is configured such that a single FD 25 is shared among the four pixels therein. When sharing components among a plurality of adjacent pixels, sharing on the same pixel column allows for easy timing control for reading out signals from the individual pixels.

The four pixels 20-1, 20-2, 20-3, and 20-4 that form the above unit respectively include photodiodes 21-1, 21-2, 21-3, and 21-4, which act as photodetectors. The four pixels 20-1, 20-2, 20-3, and 20-4 are also grouped into twos (i.e., paired). An amplifier transistor 24 is provided in the pixel region of the two pixels 20-1 and 20-2 forming one group, while a reset transistor 23 is provided in the pixel region of the two pixels 20-3 and 20-4 forming the other group.

In the pixel circuit not adopting a multi-pixel sharing architecture that was described earlier, the reset transistor 23 and the amplifier transistor 24 were both connected to the selecting power supply SELVdd at their respective drains. In other words, a common selecting power supply SELVdd was prepared as the drain power supply for both the reset transistor 23 and the amplifier transistor 24.

In contrast, in the pixel circuit in accordance with the present embodiment, separate power supplies are prepared as the respective drain power supplies for the reset transistor 23 and the amplifier transistor 24. The separate power supplies are a fixed power supply Vdd for which the power supply voltage (i.e., the voltage level) is constant, as well as a selecting power supply SELVDD whose power supply voltage is variable. The selecting power supply SELVDD selectively takes one of two power supply voltage levels: GND level (0 V) or a nearby first voltage level; and a second voltage level VDD that is higher than the voltage level Vdd of the fixed power supply Vdd, for example. By switching from the first voltage level to the second voltage level VDD, the selecting power supply SELVDD conducts pixel selection.

In addition, the drain of the reset transistor 23 is connected to the selecting power supply SELVDD, while the drain of the amplifier transistor 24 is connected to the fixed power supply Vdd. The source of the reset transistor 23 is connected to the FD 25 shared among the four vertical pixels 20-1, 20-2, 20-3, and 20-4. The reset pulse RST is selectively applied to the gate of the reset transistor 23. The gate of the amplifier transistor 24 is connected to the FD 25, while the source is connected to the vertical signal line 118.

(Circuit Operation in the Pixel Circuit in Accordance with the Present Embodiment)

Circuit operation in the four-pixel sharing pixel circuit as configured above will now be described using the timing chart shown in FIG. 12, and taking the example of the case when the charge accumulation time is 1H (where H is the horizontal scan period).

At the time t10, the selecting power supply SELVDD switches from the first voltage level (GND, for example) to the second voltage level VDD. As a result, the pixels in the first through fourth rows become selected. At the time t11, the first-row transfer pulse TRG1 and the reset pulse RST both become active, which causes both the transfer transistor 22-1 of the pixel 20-1 as well as the reset transistor 23 shared by the four pixels to be switched on. As a result, charge within the photodiode 21-1 (i.e., unwanted charge) passes through the FD 25 and is discarded into the selecting power supply SELVDD.

At the time t12, the selecting power supply SELVDD switches from the second voltage level VDD to the first voltage level, which causes the reset transistor 23 to be switched off. Doing so completes the reset operation whereby charge from the photodiode 21-1 passes through the FD 25 and the reset transistor 23 and into the selecting power supply SELVDD. This reset operation resets the photodiode 21-1 by discarding the charge within the photodiode 21-1, and is thus an electronic shutter operation regulating the charge accumulation time.

At the time t13, the first-row transfer pulse TRG1 and the reset pulse RST both become inactive (in the present example, the L level). In so doing, both the transfer transistor 22-1 of the pixel 20-1 as well as the reset transistor 23 are switched off. By switching off the transfer transistor 22-1, a photoelectrically converted signal charge (i.e., photoelectrons) begins to accumulate in the first-row photodiode 21-1.

At the subsequent time t14, the reset pulse RST becomes active again, and at the time t15, the selecting power supply SELVDD switches to the second voltage level VDD. As a result, the reset transistor 23 shared by the four pixels is switched on, which causes charge within the FD 25 shared by the four pixels to pass through the reset transistor 23 and be discarded into the selecting power supply SELVDD. As a result, the potential of the FD 25 is reset to the second voltage level VDD of the selecting power supply SELVDD.

At the time t16, the reset pulse RST becomes inactive, thereby ending the FD 25 reset operation. The potential of the FD 25 at this point becomes the reset level of the first-row pixel 20-1. This reset level, referred to as the P-phase level, is then output to the vertical signal line 118 by the amplifier transistor 24.

At the time t17, the first-row transfer pulse TRG1 becomes active, which causes the transfer transistor 22-1 of the pixel 20-1 to be switched on. As a result, the signal charge that was photoelectrically converted in the photodiode 21-1 is transferred to the FD 25 by the transfer transistor 22-1. In other words, the period between time t13 and time t17 is the accumulation period for the signal charge in the first-row pixel 20-1.

At the time t18, the first-row transfer pulse TRG1 becomes inactive, thereby ending the transfer of signal charge for the first row. At this point, the potential of the FD 25 becomes a potential corresponding to the quantity of charge in the signal charge transferred from the photodiode 21-1. This potential of the FD 25 becomes the signal level of the first-row pixel 20-1. This signal level, referred to as the D-phase level, is then output to the vertical signal line 118 by the amplifier transistor 24.

At the time t19, the second-row transfer pulse TRG2 and the reset pulse RST both become active, which causes both the transfer transistor 22-2 of the pixel 20-2 as well as the reset transistor 23 to be switched on. As a result, charge within the photodiode 21-2 passes through the FD 25 and is discarded into the selecting power supply SELVDD.

At the time t20, the selecting power supply SELVDD switches to the first voltage level GND, which causes the reset transistor 23 to be switched off. Doing so completes the reset operation whereby charge from the photodiode 21-2 passes through the FD 25 and the reset transistor 23 and is discarded into the selecting power supply SELVDD (i.e., the operation whereby the photodiode 21-2 is reset).

At the time t21, the second-row transfer pulse TRG2 becomes inactive. As a result, the transfer transistor 22-2 of the pixel 20-2 is switched off, and a photoelectrically converted signal charge begins to accumulate in the second-row photodiode 21-2.

At the subsequent time t22, the reset pulse RST becomes active, and at the time t23, the selecting power supply SELVDD switches to the second voltage level VDD. As a result, the reset transistor 23 is switched on, which causes charge within the FD 25 to pass through the reset transistor 23 and be discarded into the selecting power supply SELVDD. As a result, the potential of the FD 25 is reset to the second voltage level VDD of the selecting power supply SELVDD.

At the time t24, the reset pulse RST becomes inactive, thereby ending the FD 25 reset operation. The potential of the FD 25 at this point is then output to the vertical signal line 118 by the amplifier transistor 24 as the reset (P-phase) level of the second-row pixel 20-2.

At the time t25, the second-row transfer pulse TRG2 becomes active, which causes the transfer transistor 22-2 of the pixel 20-2 to be switched on. As a result, the signal charge that was photoelectrically converted in the photodiode 21-2 is transferred to the FD 25 by the transfer transistor 22-2. In other words, the period between time t21 and time t25 is the accumulation period for the signal charge in the second-row pixel 20-2.

At the time t26, the second-row transfer pulse TRG2 becomes inactive, thereby ending the transfer of signal charge for the second row. At this point, the potential of the FD 25 becomes a potential corresponding to the quantity of charge in the signal charge transferred from the photodiode 21-2. This potential of the FD 25 is then output to the vertical signal line 118 by the amplifier transistor 24 as the signal (D-phase) level of the second-row pixel 20-2.

At the time t27, the third-row transfer pulse TRG3 and the reset pulse RST both become active, which causes both the transfer transistor 22-3 of the pixel 20-3 as well as the reset transistor 23 to be switched on. As a result, charge within the photodiode 21-3 passes through the FD 25 and is discarded into the selecting power supply SELVDD.

At the time t28, the selecting power supply SELVDD switches to the first voltage level GND, which causes the reset transistor 23 to be switched off. Doing so completes the reset operation whereby charge from the photodiode 21-3 passes through the FD 25 and the reset transistor 23 and is discarded into the selecting power supply SELVDD (i.e., the operation whereby the photodiode 21-3 is reset).

At the time t29, the third-row transfer pulse TRG3 becomes inactive. As a result, the transfer transistor 22-3 of the pixel 20-3 is switched off, and a photoelectrically converted signal charge begins to accumulate in the third-row photodiode 21-3.

At the subsequent time t30, the reset pulse RST becomes active, and at the time t31, the selecting power supply SELVDD switches to the second voltage level VDD. As a result, the reset transistor 23 is switched on, which causes charge within the FD 25 to pass through the reset transistor 23 and be discarded into the selecting power supply SELVDD. As a result, the potential of the FD 25 is reset to the second voltage level VDD of the selecting power supply SELVDD.

At the time t32, the reset pulse RST becomes inactive, thereby ending the FD 25 reset operation. The potential of the FD 25 at this point is then output to the vertical signal line 118 by the amplifier transistor 24 as the reset (P-phase) level of the third-row pixel 20-3.

At the time t33, the third-row transfer pulse TRG3 becomes active, which causes the transfer transistor 22-3 of the pixel 20-3 to be switched on. As a result, the signal charge that was photoelectrically converted in the photodiode 21-3 is transferred to the FD 25 by the transfer transistor 22-3. In other words, the period between time t29 and time t33 is the accumulation period for the signal charge in the third-row pixel 20-3.

At the time t34, the third-row transfer pulse TRG3 becomes inactive, thereby ending the transfer of signal charge for the third row. At this point, the potential of the FD 25 becomes a potential corresponding to the quantity of charge in the signal charge transferred from the photodiode 21-3. This potential of the FD 25 is then output to the vertical signal line 118 by the amplifier transistor 24 as the signal (D-phase) level of the third-row pixel 20-3.

At the time t35, the fourth-row transfer pulse TRG4 and the reset pulse RST both become active, which causes both the transfer transistor 22-4 of the pixel 20-4 as well as the reset transistor 23 to be switched on. As a result, charge within the photodiode 21-4 passes through the FD 25 and is discarded into the selecting power supply SELVDD.

Subsequently, the reset (P-phase) level and signal (D-phase) levels for the fourth-row pixel 20-4 are similarly read and output to the vertical signal line 118 by the amplifier transistor 24. Thereafter, the above series of circuit operations treating four rows as a unit is repeated for all pixel rows.

<4. Problems when Adopting a Multi-Pixel Sharing Architecture in a Back-Illuminated Pixel Architecture>

As described earlier, adopting a multi-pixel sharing architecture in addition to a back-illuminated pixel architecture is problematic, as it involves discarding in advance the charge within the photodiodes 21 of the pixels sharing the FD 25 with respect to the readout row. This problem will now be described.

The above problem arises because a back-illuminated pixel architecture adopts a horizontal overflow drain architecture, wherein charge overflowing from a photodiode 21 passes under the gate of a transfer transistor 22 and is discarded into the FD 25. In other words, if charge lingers within a photodiode 21 of one of the pixels sharing the FD 25, then that charge passes under the low potential barrier transfer gate of the transfer transistor 22, and bleeds into the FD 25 of the pixels on the readout row. For this reason, the linearity of the signal output is not maintained, as this signal output is dependent on the charge accumulation time as regulated by the electronic shutter.

Figure 13:
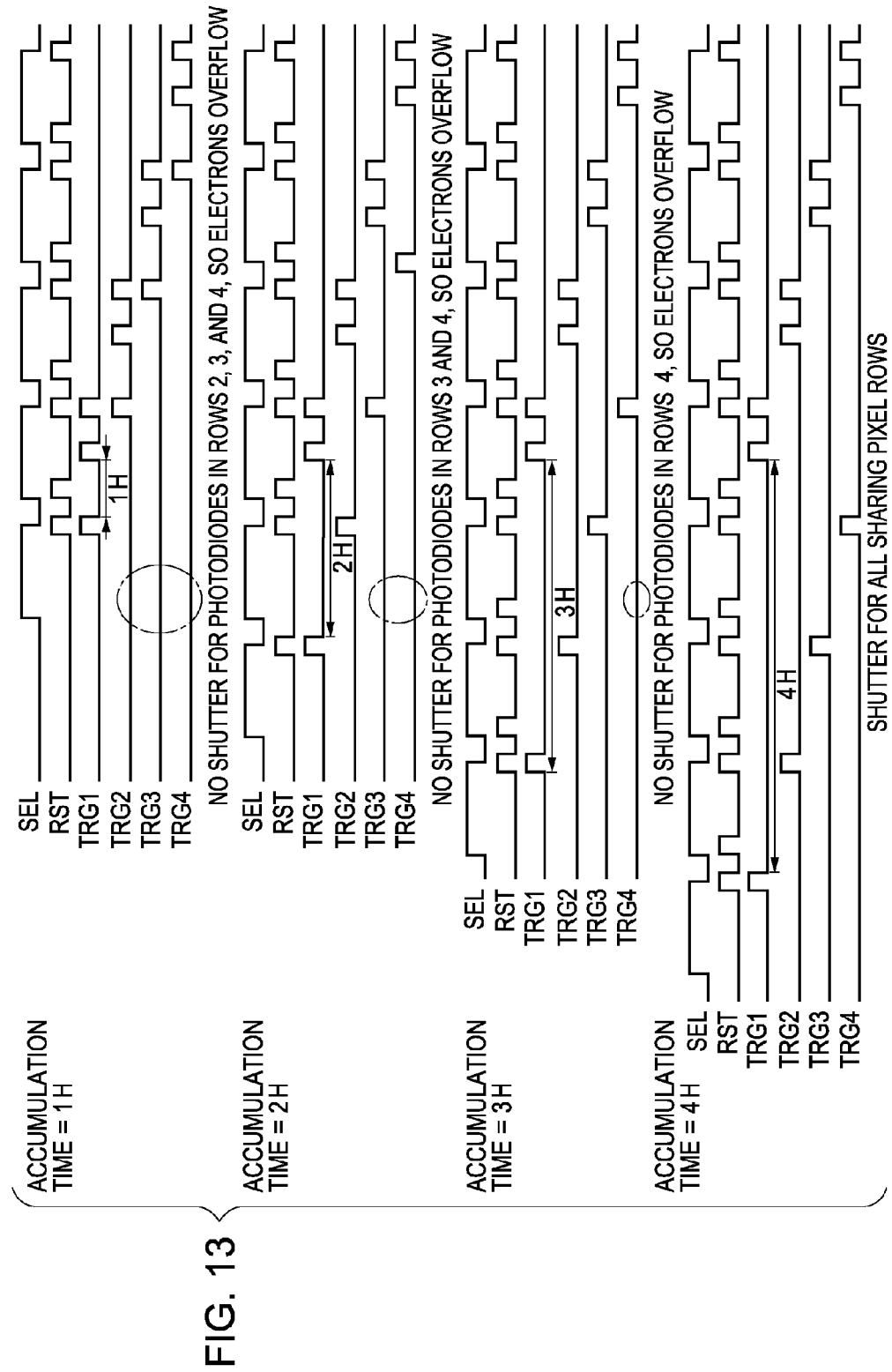
FIG. 13 is a timing chart for explaining problems in the related art regarding pixel circuits having a 4-pixel sharing architecture.

The above problem will now be described more specifically with reference to the timing chart shown in FIG. 13, taking by way of example the four-pixel sharing pixel circuit described earlier.

In the case of a four-pixel sharing pixel circuit, not all rows are subjected to a shutter operation if the charge accumulation time is a short period of 3H or less. Since a shutter operation for discarding the electrons (i.e., the charge) from the photodiodes 21 of the sharing pixels is not conducted on some rows, electrons bleed into the FD 25. More specifically, electrons overflow if the charge accumulation time is 1H because there is no shutter for the photodiodes 21-2, 21-3, and 21-4 on the second, third, and fourth rows. Electrons overflow if the charge accumulation time is 2H because there is no shutter for the photodiodes 21-3 and 21-4 on the third and fourth rows. Electrons overflow if the charge accumulation time if 3H because there is no shutter for the photodiode 21-4 on the fourth row. The above three cases are respectively indicated by the broken circles in FIG. 13.

Figure 14:
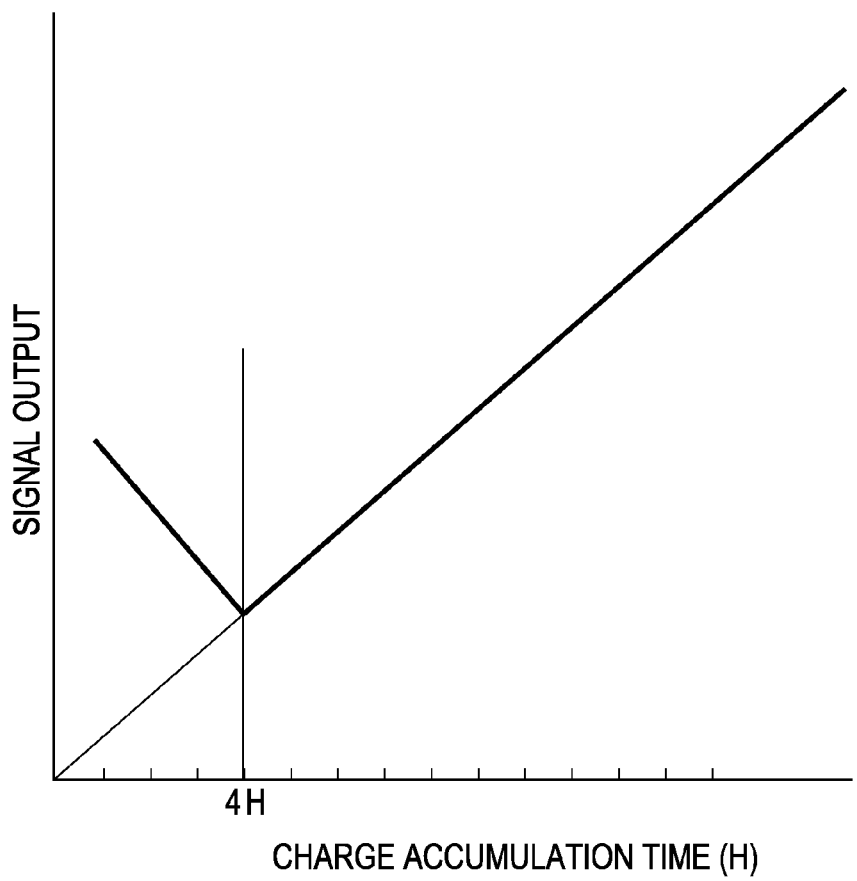
FIG. 14 explains the linearity of signal output that depends on charge accumulation time.

If electrons bleed into the FD 25 in this way, then the linearity of the signal output is not maintained, since the signal output is dependent on the charge accumulation time as regulated by the electronic shutter, as shown in FIG. 14. In the case of a four-pixel sharing pixel circuit, the linearity of the signal output is maintained for charge accumulation times not less than 4H. However, for charge accumulation times of 3H or less, the linearity of the signal output is lost.

Figure 15:
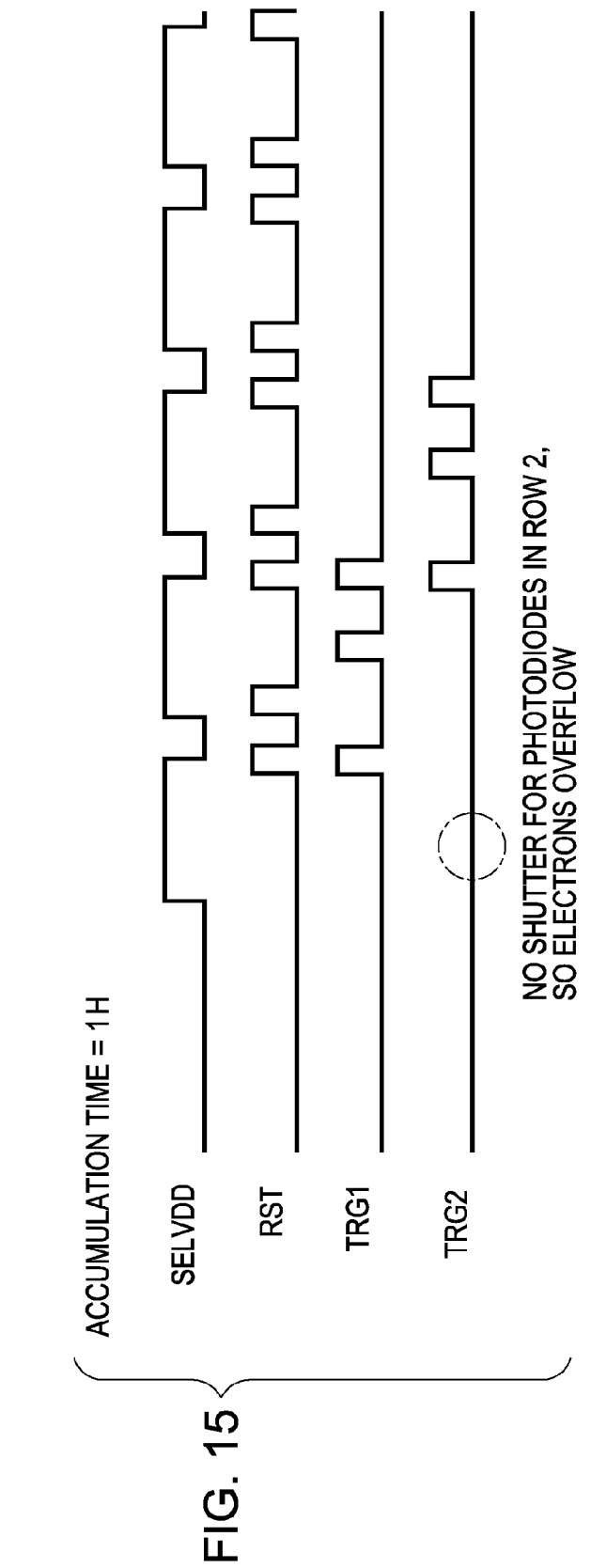
FIG. 15 is a timing chart for explaining problems in the related art regarding pixel circuits having a 2-pixel sharing architecture.

The foregoing describes the case of a four-pixel sharing pixel circuit by way of example, but a similar problem also occurs in other pixel sharing circuits not made up of four-pixel units. For example, in the case of a two-pixel sharing pixel circuit, a shutter operation is not conducted for the photodiode 21 of the sharing pixel if the charge accumulation time is a short period of 1H, as shown in FIG. 15. For this reason, the dependency of the signal output on the charge accumulation time is lost when the charge accumulation time is 1H.

In other words, given a pixel circuit wherein the FD 25 is shared among n pixels (where n is an integer equal to or greater than 2), the linearity of the signal output depending on the charge accumulation time is not maintained when the charge accumulation is a short period of (n−1)H or less.

Although the problem of signal output non-linearity with respect to charge accumulation time has been described taking a back-illuminated pixel architecture by way of example, this problem is not limited to back-illuminated pixel architectures. In other words, it is conceivable to adopt a horizontal overflow drain architecture for discarding charge overflowing from a photodetector 51 into an FD 54, even in front-illuminated pixel architectures.

More specifically, in FIG. 1, a horizontal overflow drain architecture is realized by setting the voltage value of the gate voltage applied to the transfer gate 53 such that the potential barrier under the transfer gate 53 is lower than the potential barrier at the floor of the photodetector 51. When a horizontal overflow drain architecture is adopted in this way, the linearity of the signal output depending on the charge accumulation time is not maintained, even in a front-illuminated pixel architecture.

<5. Characteristics of the Present Embodiment>

As described above, in a solid state image sensor having a horizontal overflow drain architecture in accordance with the present embodiment, the problem of the non-linearity of the signal output depending on the charge accumulation time is resolved when adopting a multi-pixel sharing architecture wherein at least the FD 25 is shared among a plurality of pixels. Furthermore, the present embodiment is configured to perform the following when adopting a multi-pixel sharing architecture. While reading out signals from the pixels 20 on the readout row, the charge is reset in the photodiodes 21 of the pixels sharing the FD 25 (i.e., the sharing pixels). The charge reset is conducted simultaneously with or before (i.e., prior to) reading out the signals from the pixels 20 on the readout row.

Hereinafter, the feature of the present embodiment will be described in more detail. Herein, the multi-pixel sharing architecture will be described by way of example as the four-pixel sharing architecture shown in FIG. 6, wherein the FD 25 is shared among four nearby pixels belonging to the same pixel column. However, it should be appreciated that the following is not limited in application to a four-pixel sharing architecture.

Figure 12:
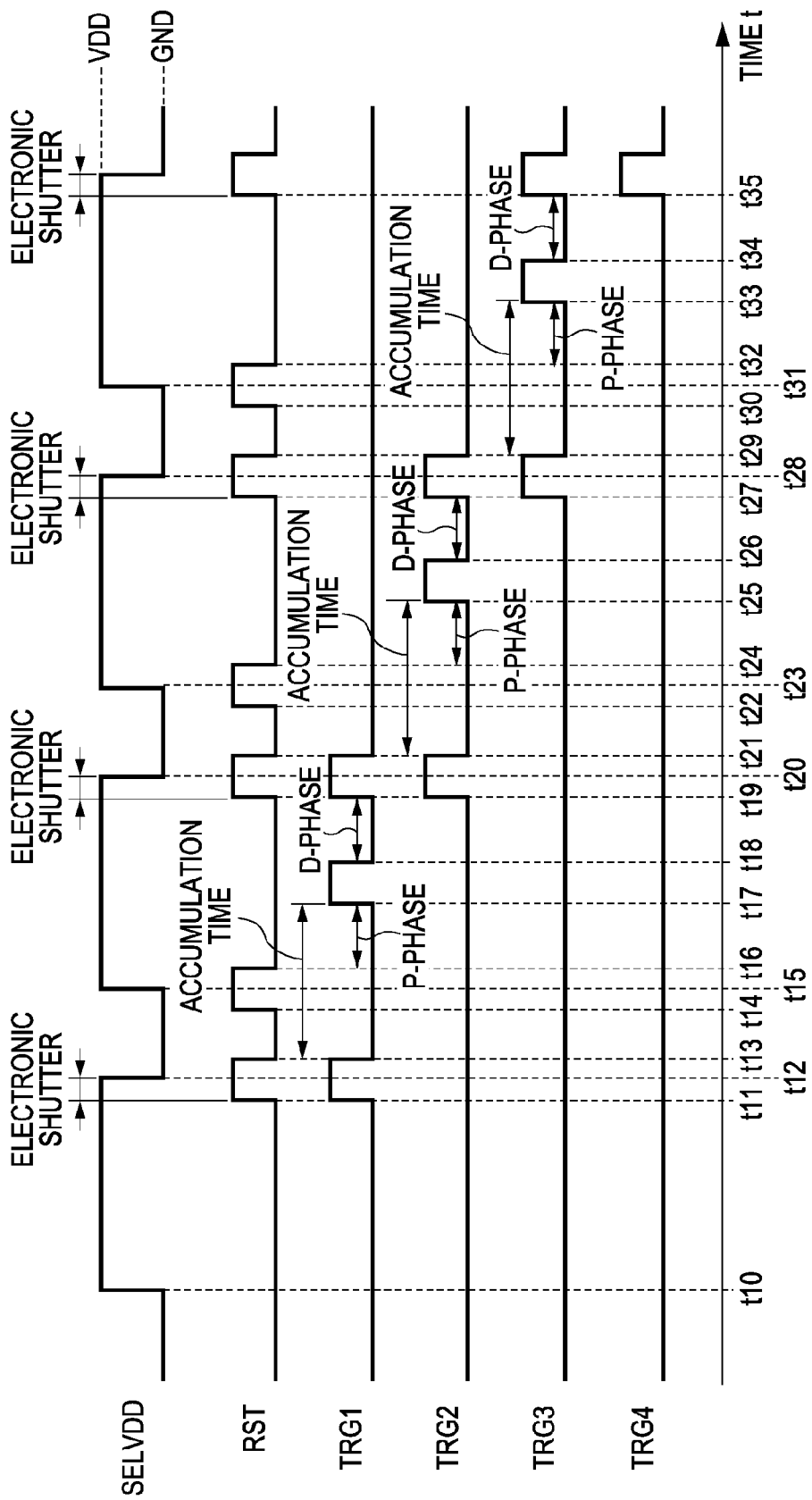
FIG. 12 is a timing chart for explaining circuit operation in a pixel circuit having a 4-pixel sharing architecture.

A solid state image sensor adopting a four-pixel sharing architecture may be driven by circuit operations based on the timing chart shown in FIG. 12 and described earlier by way of example. When driving the image sensor in this way, a reset operation to discard the charge within the photodiodes 21-1 to 21-4 (i.e., an electronic shutter operation) is conducted for each of the four pixels 20-1 to 20-4 sharing the FD 25, but only when a particular pixel is selected as part of the readout row as a result of scanning by the row scanner 113.

More specifically, in the timing chart shown in FIG. 12, an electronic shutter operation is conducted for the first-row pixel 20-1 during the period from t11 to t12, for the second-row pixel 20-2 during the period t19 to t20, for the third-row pixel 20-3 during the period t27 to t28, and similarly thereafter. In other words, on each readout row selected by the row scanner 113, an electronic shutter operation for regulating the charge accumulation time is conducted one time as the reset operation for the photodiodes 21-1 to 21-4, respectively.

When the image sensor is driven in this way, such that a reset operation for discarding charge within a photodiode 21 is conducted only when the pixel containing that photodiode 21 is selected as part of the readout row, charge lingers within the photodiodes 21 of the other sharing pixels before reading out the signal from the pixel 20 on the readout row. Moreover, in a solid state image sensor having a horizontal overflow drain architecture, there is the problem of the non-linearity of the signal output with respect to the charge accumulation time, which occurs when lingering charge within the photodiodes 21 of the sharing pixels passes under the gates of the transfer transistors 22 and bleeds into the pixel on the readout row, as described earlier.

Figure 16:
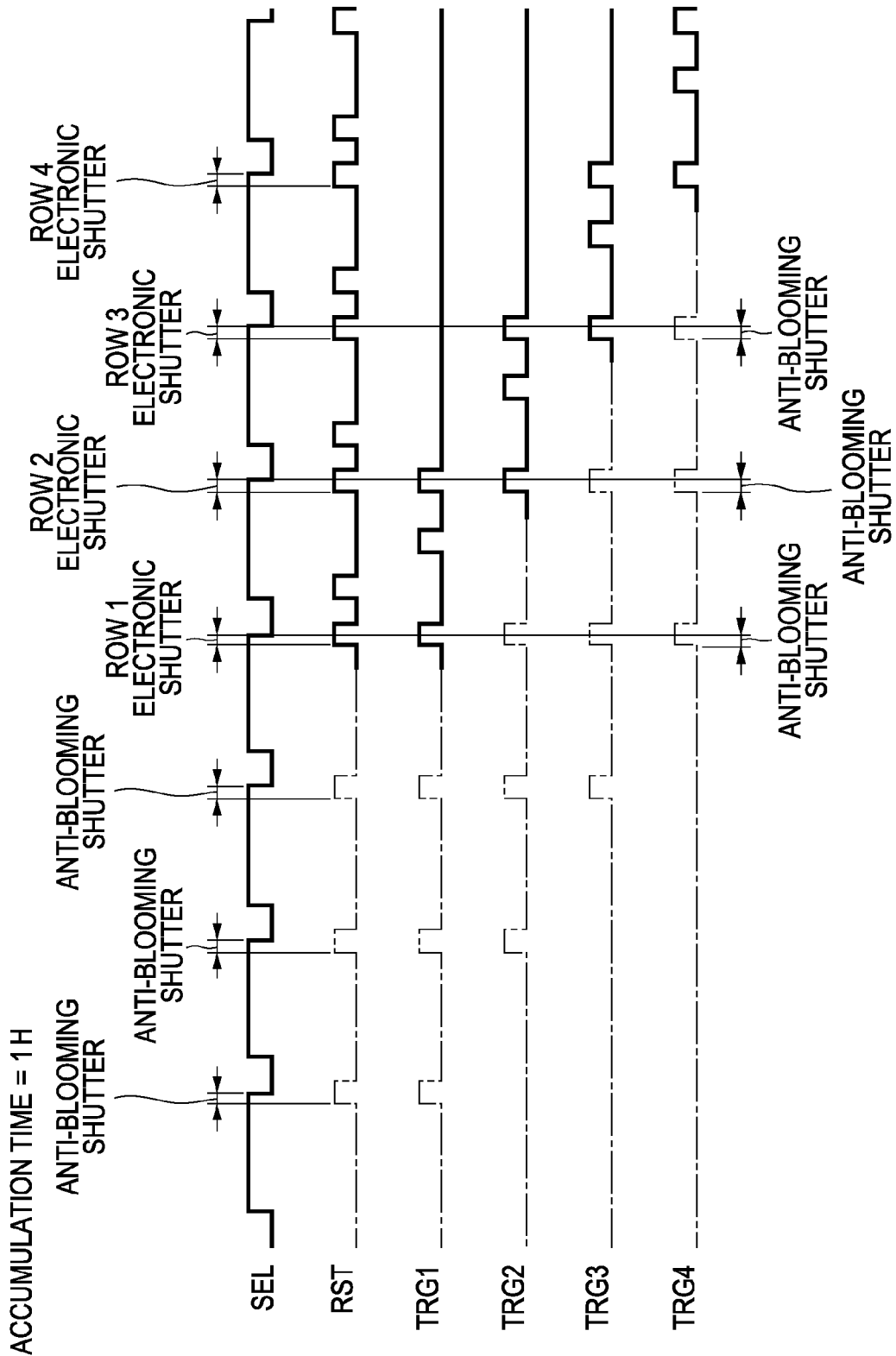
FIG. 16 is a timing chart for explaining pixel driving in a CMOS image sensor in accordance with an embodiment of the present invention, in the case of a 4-pixel sharing architecture.

Consequently, in a solid state image sensor having a horizontal overflow drain architecture and also adopting a multi-pixel sharing architecture in accordance with the present embodiment, the charge within the photodiodes 21 of the sharing pixels is reset either simultaneously with or prior to reading out the signal from the pixel 20 on the readout row. The specifics of the image sensor driving will now be described with reference to the timing chart shown in FIG. 16. FIG. 16 illustrates relationships among the drive timings for the first through fourth rows, in the case where the charge accumulation time is 1H.

Herein, the case of the first row being selected as the readout row by the row scanner 113 is described by way of example. When the first row is selected as the readout row, an electronic shutter operation is conducted, preceding the reading out of signals from each pixel on the first row. As explained in the description of circuit operation made with reference to FIG. 12, this electronic shutter operation determines the charge accumulation time for the signal charge in the photodiode 21-1. More specifically, in the timing chart shown in FIG. 12, signal charge accumulation is initiated at the time t13, when the reset pulse RST and the transfer pulse TRG1 both become inactive.

In the present example, reset operations are conducted with respect to the sharing pixels (i.e., the photodiodes 21-2 to 21-4 in the pixels 20-2 to 20-4 on the second through fourth rows, respectively), coincident with the timing of the first-row electronic shutter. These reset operations are conducted by the row scanner 113 under control by the system controller 116.

More specifically, when the first-phase transfer pulse TRG1 and the reset pulse RST become active, the transfer pulses TRG2 to TRG4 for the second to fourth rows also become active, which causes the transfer transistors 22-2 to 22-4 in the second to fourth rows to be switched on. For this reason, the charge within each photodiode 21-2 to 21-4 on the second to fourth rows passes through the FD 25 and the reset transistor 23 and is discarded into the selecting power supply SELVDD.

These reset operations are conducted with respect to the sharing pixels, and are different from the electronic shutter operation conducted with respect to the pixel on the readout row. These reset operations are similar to the anti-blooming shutter operations conducted in the technology disclosed in Japanese Unexamined Patent Application Publication No. 2008-288904, and thus are also referred to as anti-blooming shutter operations in the present specification.

Figure 17:
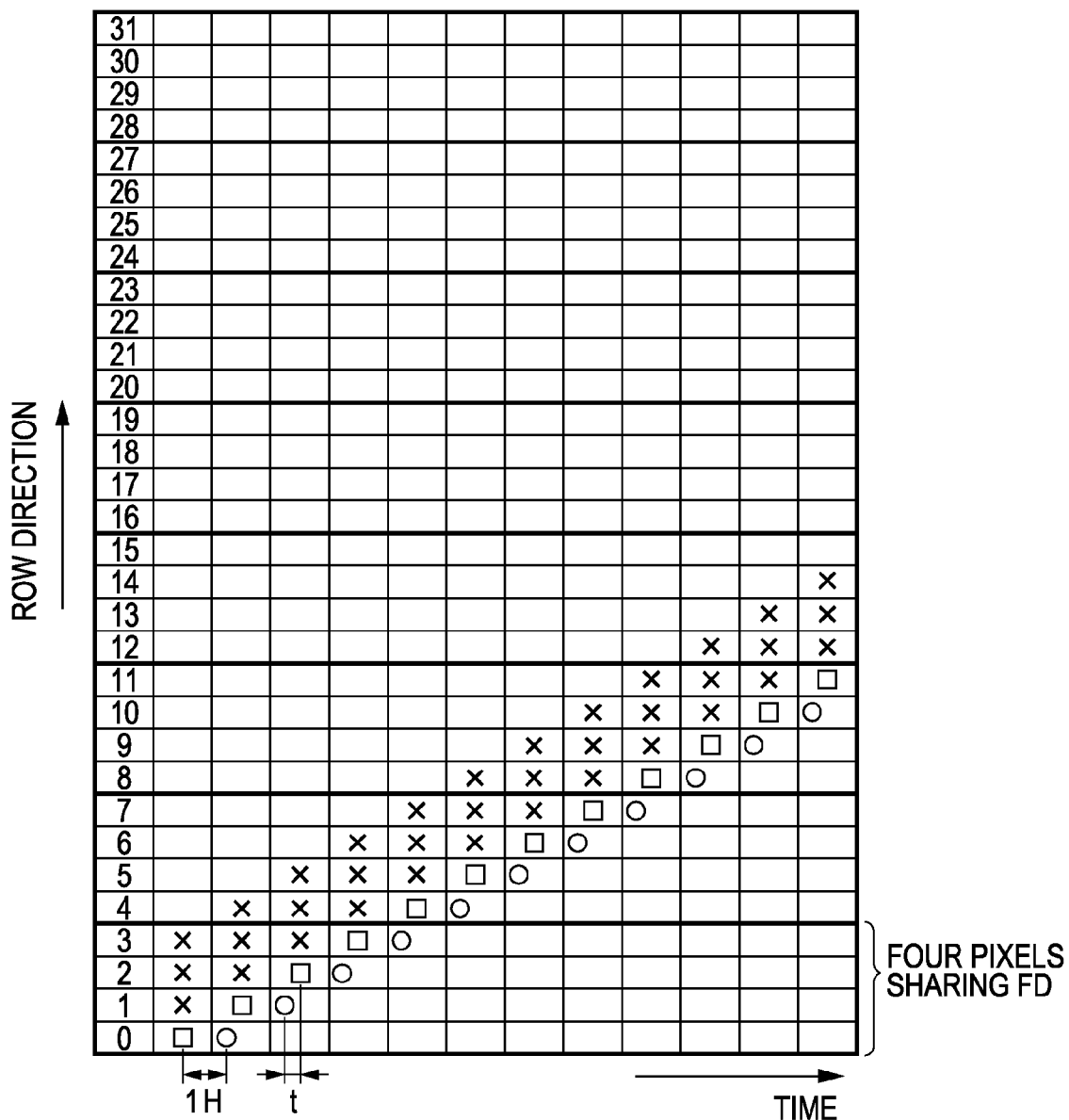
FIG. 17 explains anti-blooming shutter operation in the case of serial readout.

In the case of four-pixel sharing, the anti-blooming shutter operations for three sharing pixels are synchronized with the electronic shutter operation for the fourth pixel on the readout row, as shown in FIG. 17. In FIG. 17, a circle denotes the readout timing for reading out a signal from the pixel on the readout row, a square denotes the electronic shutter timing with respect to the readout row, and a cross denotes the anti-blooming shutter timing for the sharing pixels.

Furthermore, in FIG. 17, the time between a circle and a square on the same pixel row indicates the charge accumulation time for the signal charge (in the present example, 1H). Also, in FIG. 17, the time t between a circle and a square on adjacent pixel rows indicates the timing difference (see FIG. 12) between the signal readout and the electronic shutter on the adjacent pixel rows.

In the example shown in FIG. 17, if the charge accumulation time is taken to be 1H and the readout row is taken to be the zeroth row, then the zeroth-row electronic shutter operation is conducted 1H before the zeroth-row readout operation. Anti-blooming shutter operations for the sharing pixels (i.e., the respective pixels on the first through third rows) are conducted at the same timing as that of the zeroth-row electronic shutter operation. These electronic shutter, anti-blooming, and readout operations are then repeated in order on a per-row basis.

By means of the above anti-blooming shutter operations, the charge inside the photodiodes 21 of all sharing pixels can be discarded before conducting the readout operation for reading out a signal from the pixel on the readout row. In so doing, charge is prevented from overflowing from the photodiodes 21 of all sharing pixels and bleeding into the FD 25 shared by the four pixels before a signal is read out from the pixel on the readout row. For this reason, the linearity of the signal output with respect to the charge accumulation time of the pixel on the readout row can be maintained.

This technology for maintaining the linearity of the signal output with respect to the charge accumulation time is particularly useful when applied to a solid state image sensor adopting a back-illuminated pixel architecture. This is because back-illuminated pixel architectures lack a substrate into which to discard charge overflowing from the photodiodes 21, and as a result, most back-illuminated pixel architectures adopt a horizontal overflow drain architecture wherein the charge passes under the gate of a transfer transistor 22 and is discarded into the FD 25.

In the present example, the anti-blooming shutter operations with respect to the sharing pixels are coincident with the timing of the electronic shutter operation for the readout row, or in other words, before reading out the signal from the pixel on the readout row. However, it is also possible to conduct the anti-blooming shutter operations simultaneously with reading out the signal from the pixel on the readout row.

Herein, the reading out of the signal from the pixel on the readout row starts with the reading out of the reset (P-phase) level, as shown in the timing chart in FIG. 12. Consequently, the point of simultaneity with the reading out of the signal from the pixel on the readout row refers to the time t16 (in the case of the first row being the readout row), at which point the selecting power supply SELVDD is at the second voltage level VDD and the reset pulse RST transitions from an active state to an inactive state.

(Sampling Readout)

The foregoing thus describes an embodiment of technology for maintaining the linearity of the signal output with respect to the charge accumulation time as applied to sequential readout, wherein individual pixels 20 in the pixel array 12 are scanned and read by the row scanner 113 in order on a per-row basis. However, the above may also be applied to sampling readout. Herein, sampling readout refers to technology for skipping pixel rows at a fixed row interval, and reading out signals from the pixels on the remaining pixel rows. Fast imaging can be realized by using such sampling readout, since the number of vertical readout lines (i.e., the number of rows or lines) can be reduced.

When applying the above embodiment to sampling readout, anti-blooming shutter operations may be similarly conducted with respect to the photodiodes 21 of all sharing pixels, simultaneously with (or prior to) reading out signals from the pixels on the pixel row selected as the readout row.

For example, consider the case of ⅓ sampling readout, wherein rows are divided into threes, skipping two rows and reading out signals from the remaining row. In this case, the timing relationships among the electronic shutter, anti-blooming, and readout operations are as shown in FIG. 18.

Figure 18:
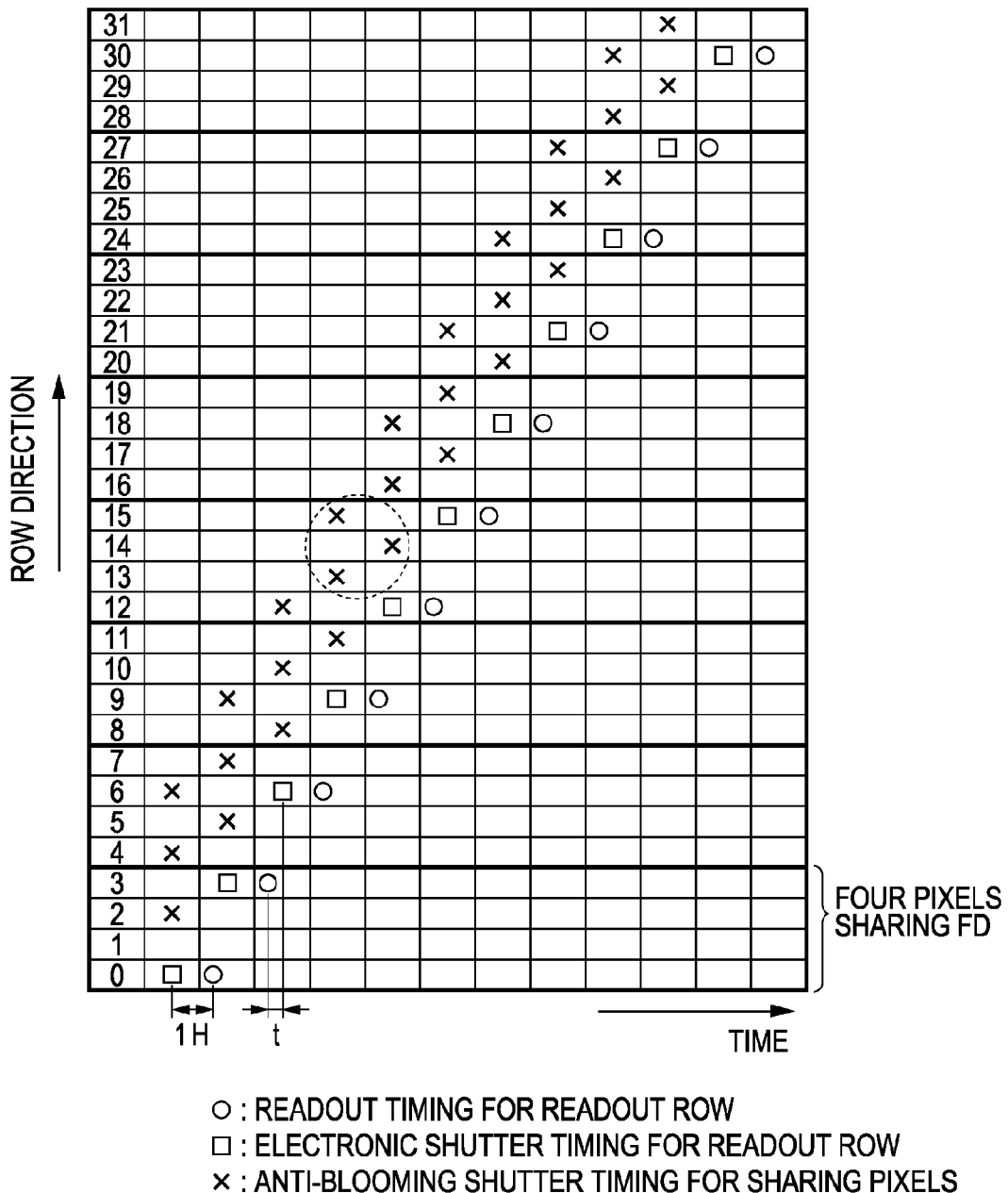
FIG. 18 explains anti-blooming shutter operation in the case of readout with ⅓ sampling.

In FIG. 18, the time between a circle and a square on the same pixel row indicates the charge accumulation time for the signal charge (in the present example, 1H). Also, the time between a circle and a square on adjacent pixel rows indicates the timing difference between the signal readout and the electronic shutter on the adjacent pixel rows.

In the case of ⅓ sampling readout, the zeroth, third, sixth, ninth, twelfth, . . . , pixel rows are selected in order as the readout rows. Herein, if the twelfth row is to be selected as the readout row, for example, then the twelfth-row electronic shutter operation is conducted 1H before the twelfth-row readout operation.

Additionally, an anti-blooming shutter operation is conducted for one of the sharing pixels (specifically, the pixel on the fourteenth row) at the same timing as that of the twelfth-row electronic shutter operation. Anti-blooming shutter operations are also conducted for the other sharing pixels (specifically, the pixels on the thirteenth and fifteenth rows) at an electronic shutter operation prior to the twelfth-row electronic shutter operation.

In so doing, when reading out a signal from a single pixel from among four pixels sharing the FD 25, anti-blooming shutter operations are conducted with respect to the photodiodes 21 of all sharing pixels before reading out the signal from the pixel. In the present example, when reading out the signal from the twelfth-row pixel, an anti-blooming shutter operation is conducted for the fourteenth-row pixel at the electronic shutter timing of the readout pixel, while anti-blooming shutter operations are conducted for the thirteenth-row and fifteenth-row pixels at a prior electronic shutter timing, as shown by the symbols enclosed by a broken circle in FIG. 18.

Figure 19:
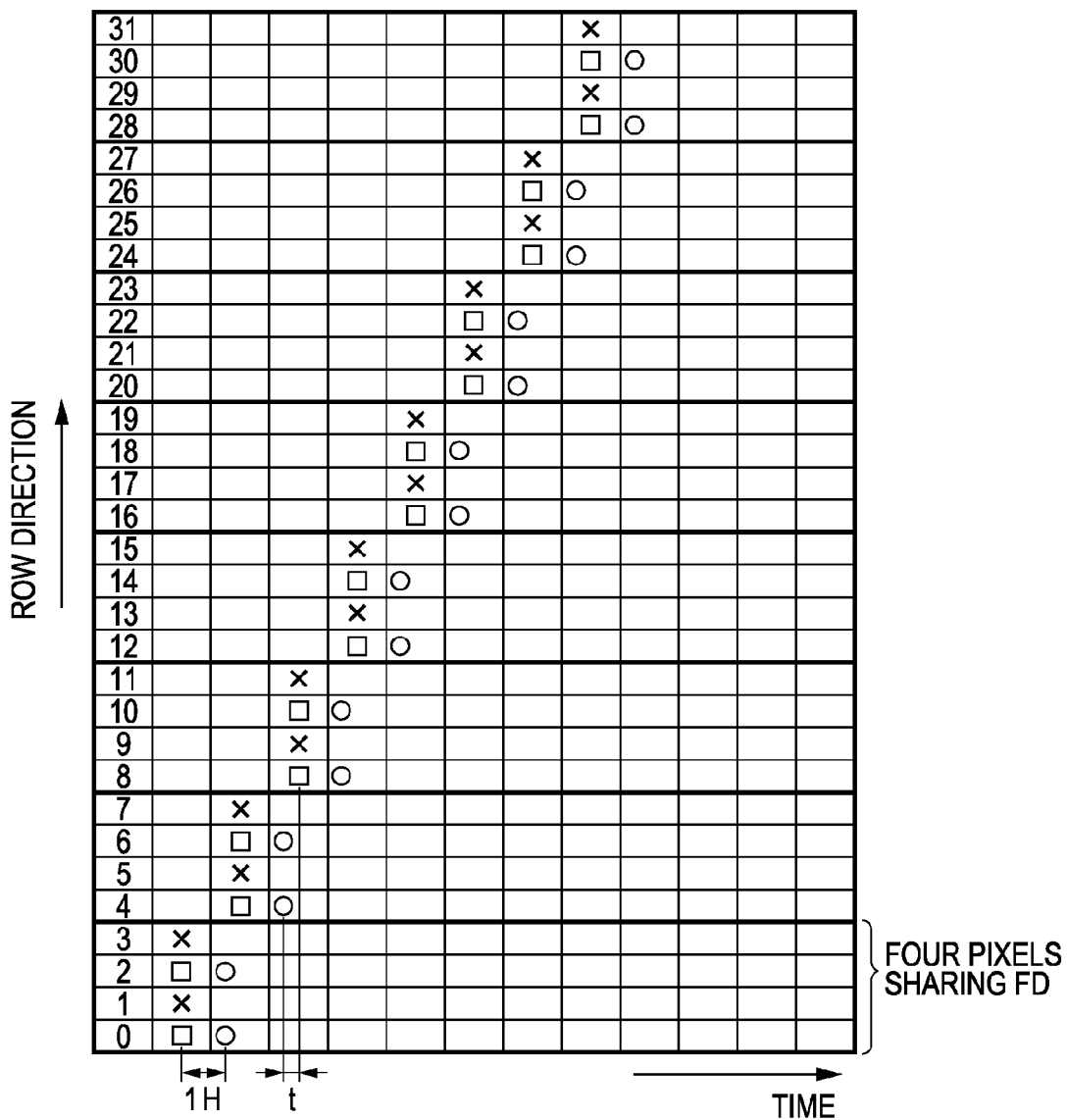
FIG. 19 explains anti-blooming shutter operation in the case of readout with ⅖ sampling.
Figure 20:
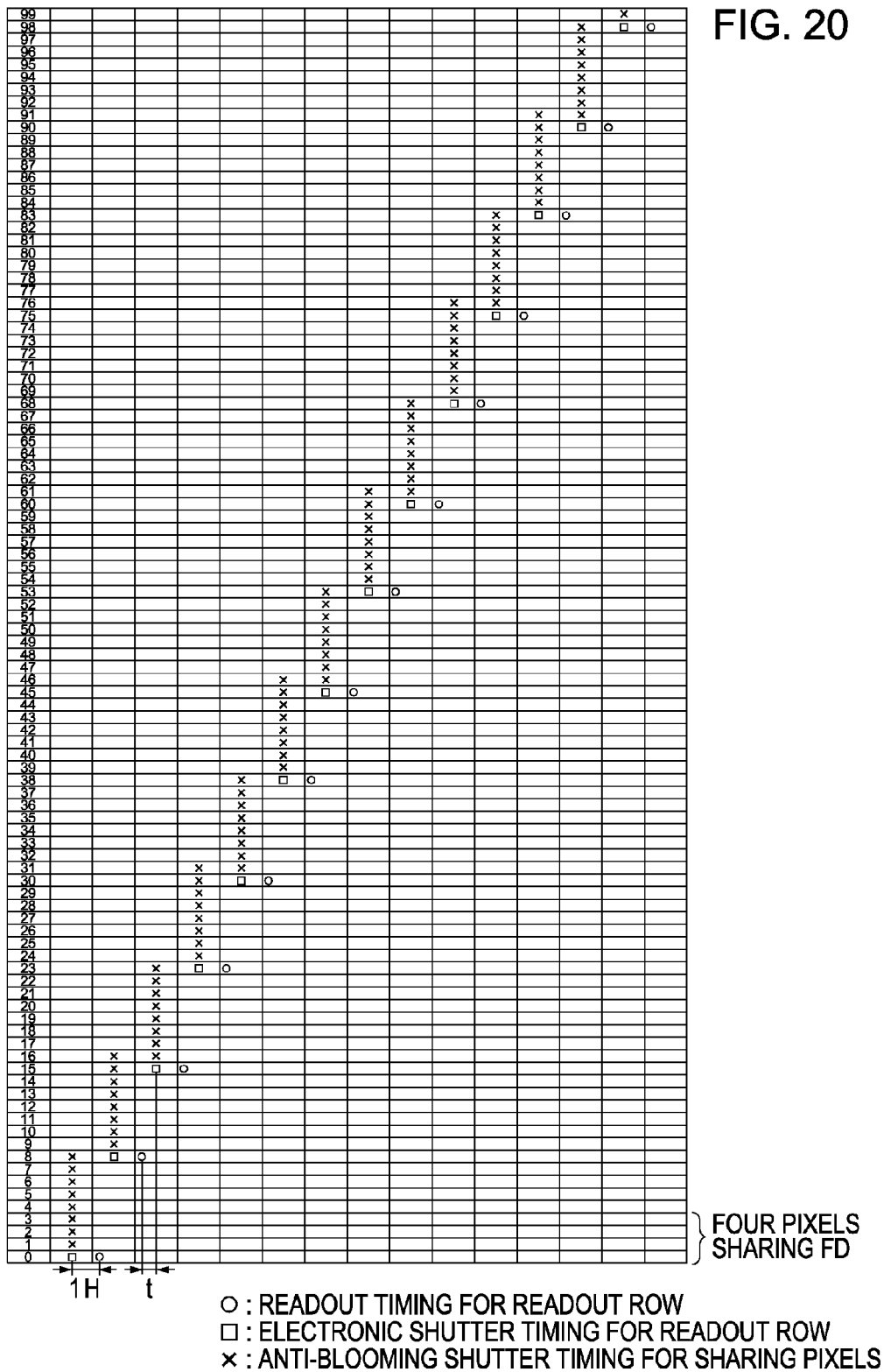
FIG. 20 explains anti-blooming shutter operation in the case of readout with 2/15 sampling.
Figure 21:
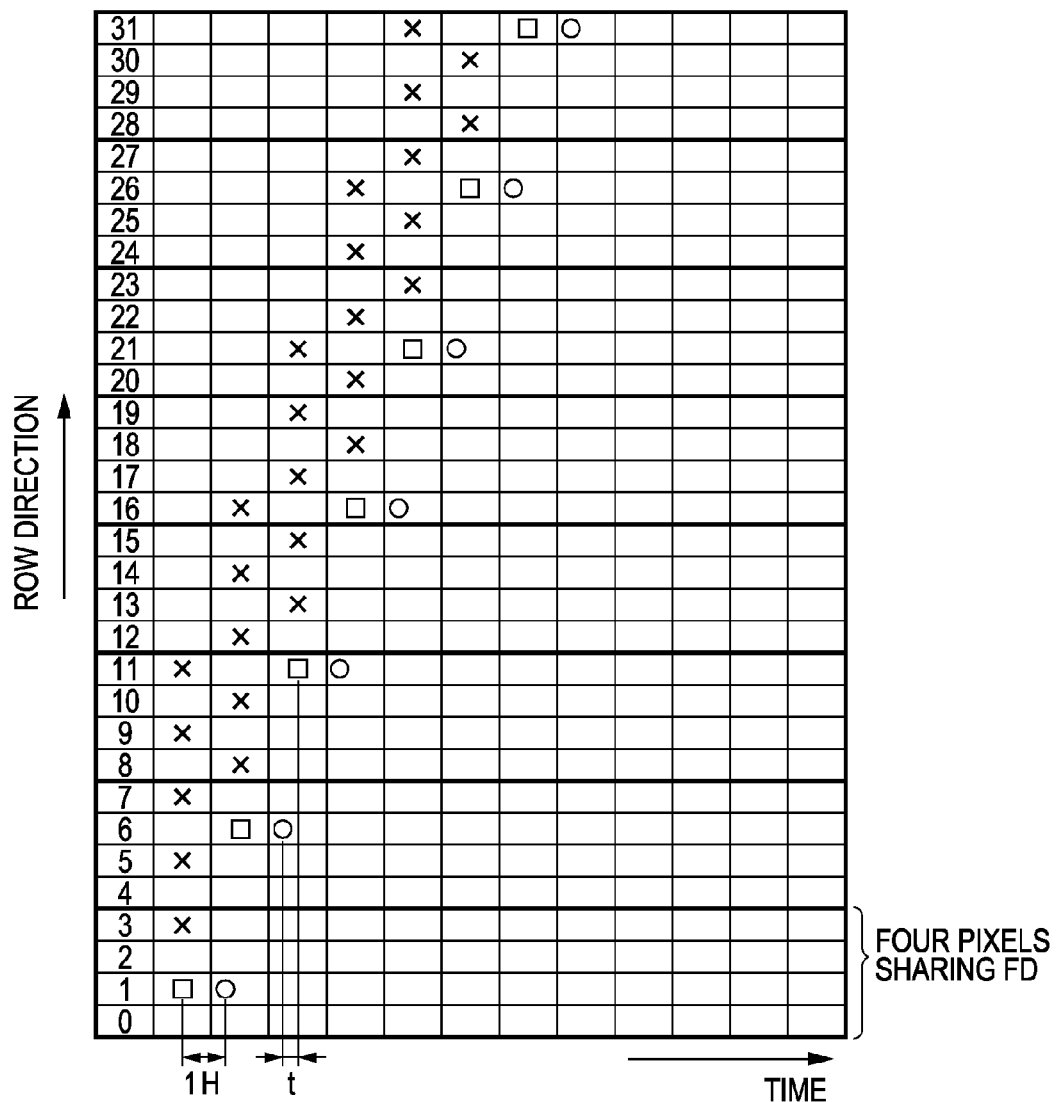
FIG. 21 explains anti-blooming shutter operation in the case of readout with ⅕ sampling.

FIGS. 19, 20, and 21 illustrate the timing relationships among the electronic shutter, anti-blooming shutter, and readout operations for other sampling readout patterns. In FIGS. 19, 20, and 21, the time between a circle and a square on the same pixel row indicates the charge accumulation time for the signal charge (in the present example, 1H). Also, the time between a circle and a square on adjacent pixel rows indicates the timing difference between the signal readout and the electronic shutter on the adjacent pixel rows.

FIG. 19 explains anti-blooming shutter operation in the case of ⅖ sampling readout. FIG. 20 explains anti-blooming shutter operation in the case of 2/15 sampling readout. FIG. 21 explains anti-blooming shutter operation in the case of ⅕ sampling readout.

As FIGS. 18 to 21 demonstrate, the shutter counts for the anti-blooming shutter operations differ among the respective sampling operations. Regardless of which sampling readout pattern is used, however, pixels sharing the FD 25 are treated as a unit, with anti-blooming shutter operations being conducted with respect to the photodiodes 21 of all sharing pixels prior to (or simultaneously with) the reading out of a signal from the pixel on the readout row.

In this way, by applying the technology in accordance with the present embodiment to sampling readout, fast imaging can be realized while also maintaining the linearity of the signal output with respect to the charge accumulation time. Herein, when applying the technology in accordance with the present embodiment to sampling readout, it is preferable to configure the shutter counts for the anti-blooming shutter operations (i.e., the number of times the photodiodes 21 are reset) to be the same at each electronic shutter timing for respective readout rows (see FIGS. 18 to 21).

By configuring the shutter counts for the anti-blooming shutter operations to be the same at each electronic shutter timing for respective readout rows, the phenomenon referred to as shutter banding can be suppressed, thereby enabling favorable images to be obtained. Shutter banding herein refers to a phenomenon wherein horizontal bands appear in acquired images due to shutter operations stopping during the vertical imaging period. These bands then move up and down in accordance with the shutter speed.

Although described by way of example as being applied to a CMOS image sensor, the foregoing embodiment is not limited in application to CMOS image sensors. In other words, it is also possible to apply to general X-Y addressing solid state image sensors, wherein unit pixels are arranged in an array, with each unit pixel detecting a physical quantity in the form of a charge corresponding to the intensity of visible light, and then outputting the detected result as an electrical signal.

It should be appreciated that the solid state image sensor may formed as a single-chip solution, or as a module having packaged imaging functions and containing an imager as well as either a signal processor or optics.

<6. Electronic Device>

A solid state image sensor in accordance with an embodiment of the present invention may also be incorporated into general electronic devices that use a solid state image sensor as part of an imager (i.e., a photodetecting unit). Such electronic devices may include: camera systems such as digital still or video cameras; portable devices having imaging functions, such as mobile phones; and copiers that use a solid state image sensor as part of a scanner. In some cases, the image sensor may be provided as a camera module incorporated into an electronic device.

(Imaging Apparatus)

FIG. 9 is a block diagram illustrating an exemplary configuration of an imaging apparatus in accordance with an embodiment of the present invention, being one example of an electronic device. As shown in FIG. 9, the imaging apparatus 100 in accordance with an embodiment of the present invention includes: optics, including components such as a lens group 101; an image sensor 102, a DSP circuit 103 that acts as a camera signal processor; frame memory 104; a display 105; a recording unit 106; a user interface system 107; and a power supply system 108. The DSP circuit 103, the frame memory 104, the display 105, the recording unit 106, the user interface system 107, and the power supply system 108 are connected to each other via a bus line 109.

The lens group 101 captures incident light from the subject (i.e., image light) and focuses the captured light onto the photodetector surface of the image sensor 102. The image sensor 102 converts the intensity of the incident light focused onto its photodetector surface by the lens group 101 into electrical signals in units of pixels, and then outputs the result as pixel signals. The CMOS image sensor in accordance with the foregoing embodiment may be used as the image sensor 102 herein.

The display 105 is made up of a panel-type display apparatus, such as a liquid-crystal display (LCD) or organic electro luminescent (organic EL) display. The display 105 displays video or still images acquired by the image sensor 102. The recording unit 106 records video or still images acquired by the image sensor 102 onto a recording medium, such as a video tape or a DVD (Digital Versatile Disc).

On the basis of operations made by the user, the user interface system 107 issues operational instructions for various functions of the imaging apparatus. The power supply system 108 appropriately supplies power to the various power supplies that act as the operative power supplies for the DSP circuit 103, the frame memory 104, the display 105, the recording unit 106, and the user interface system 107.

Such an imaging apparatus 100 may be applied to a video camera or digital still camera, and furthermore to a camera module for mobile devices such as mobile phones. By applying the CMOS image sensor in accordance with the foregoing embodiment as the image sensor 102 in the imaging apparatus 100, the linearity of the signal output with respect to the charge accumulation time can be maintained by the CMOS image sensor, and thus favorable images can be provided.

<7. Pixel Unit Example>

Similarly to the foregoing embodiments, the embodiment to be hereinafter described can be applied to apparatus having an image sensor, such as digital video cameras and digital still cameras, for example. Furthermore, since the imaging apparatus to be hereinafter described can be miniaturized while still preventing degradation of imaging performance, the imaging apparatus can also be applied to mobile handsets, such as to a camera provided in a mobile phone.

Thus, one feature of an imaging apparatus in accordance with the present embodiment is its ability to be miniaturized. First, several points to consider when miniaturizing an imaging apparatus will be given, and a specific configuration taking such points into account will be described with reference to FIG. 22.

Hereinafter, the following reference numbers are used: 350 is an image sensor, 351 to 358 are pixels, 361 to 368 are photodiodes PD, 371 to 378 are transfer transistors TRF, 381 and 382 are amplifier transistors AMP, 391 and 392 are floating diffusions FD, 401 is a reset transistor RST, and 402 is a reset drain RDN.

In imaging apparatus, CMOS (Complementary Metal Oxide Semiconductor) image sensors (CIS) are often used for their low power consumption. In a CIS, each pixel includes a photodetector (i.e., a photodiode PD) as well as a transfer transistor (TRF). Typically, each pixel also includes a floating diffusion (FD), an amplifier transistor (AMP), a reset transistor (RST), and a selection transistor (SEL).

One performance metric for imaging apparatus used in digital cameras and similar devices is the signal to noise ratio (S/N). Improve the S/N characteristics of an imaging apparatus involves increasing the signal (S), or decreasing the noise (N).

The signal (S) is determined by the intensity of incident light, the quantization efficiency (i.e., the rate at which incident light is photoelectrically converted, lead into the photodiode, and stored as signal charge), and the conversion efficiency (i.e., the ratio whereby a single electron is converted into a potential). The intensity of incident light depends on the pixel size. The quantization efficiency depends on the aperture ratio of the photodiode (i.e., the surface area of the aperture of the photodiode per unit pixel surface area). Given such relationships, if the pixel size is reduced, then the intensity of light incident on the pixel is decreased, resulting in the signal also being decreased.

The noise (N) is made up of components such as 1/f noise, shot noise, and thermal noise. Since the shot noise depends on the intensity of incident light, its effects are increased in tiny pixels subject to incident light of lower intensity. The 1/f noise depends on the gate length (L) and the gate width (W) of the transistors, and tends to increase with smaller transistor sizes.

As described above, if the pixel size is reduced, then the intensity of incident light per pixel is physically decreased, thereby decreasing the signal (S). Furthermore, shot noise increases, since it depends on the intensity of incident light, thereby increasing the noise (N). In addition, if the transistor footprint in each unit pixel is increased, then the aperture ratio of the photodiode PD decreases, leading to a lowered quantization rate along with decreased signal (S). On the other hand, if the transistor footprint is made smaller, then 1/f noise increases, leading to increased noise (N).

Miniaturization of an imaging apparatus (more specifically, the pixels constituting the imaging apparatus) is thus disadvantageous with respect to the S/N ratio. Being determined by a physical quantity, the intensity of incident light is not subject to improvement. For this reason, improving the S/N ratio involves improving the quantization and conversion efficiencies, or decreasing the noise.

One way of improving the signal (S) is by raising the aperture ratio of the photodiode PD to thereby increase the quantization efficiency. An effective method for raising the aperture ratio of the photodiode PD is multi-pixel sharing, wherein the amplifier transistor AMP, the selection transistor SEL, the reset transistor RST, and the floating diffusion FD are shared among adjacent pixels.

For example, consider a CIS in a four-transistor configuration. The amplifier transistor AMP, the selection transistor SEL, the reset transistor RST, and the floating diffusion FD are shared by two adjacent pixels, with each pixel containing a photodiode PD and a transfer transistor TRF. Configuring a CIS in this way keeps the number of transistor regions per pixel to $(1\times2+3)/2=2.5$, and is advantageous for raising the aperture ratio of the photodiode PD.

Additionally, the amplifier transistor AMP, the selection transistor SEL, the reset transistor RST, and the floating diffusion FD may be shared among four adjacent pixels, with each pixel containing a photodiode PD and a transfer transistor TRF. Configuring a CIS in this way keeps the number of transistors regions per pixel to $(1\times4+3)/4=1.75$, and is more advantageous for raising the aperture ratio of the photodiode PD.

Now consider a configuration wherein the CIS pixel architecture is changed to a three-transistor type, wherein the amplifier transistor AMP, the reset transistor RST, and the floating diffusion FD are shared among four adjacent pixels, with each pixel containing a photodiode PD and a transfer transistor TRF. Configuring a CIS in this way keeps the number of transistor regions per pixel to (1×4+2)/4=1.5, and is even more advantageous for raising the aperture ratio of the photodiode PD.

Figure 22:
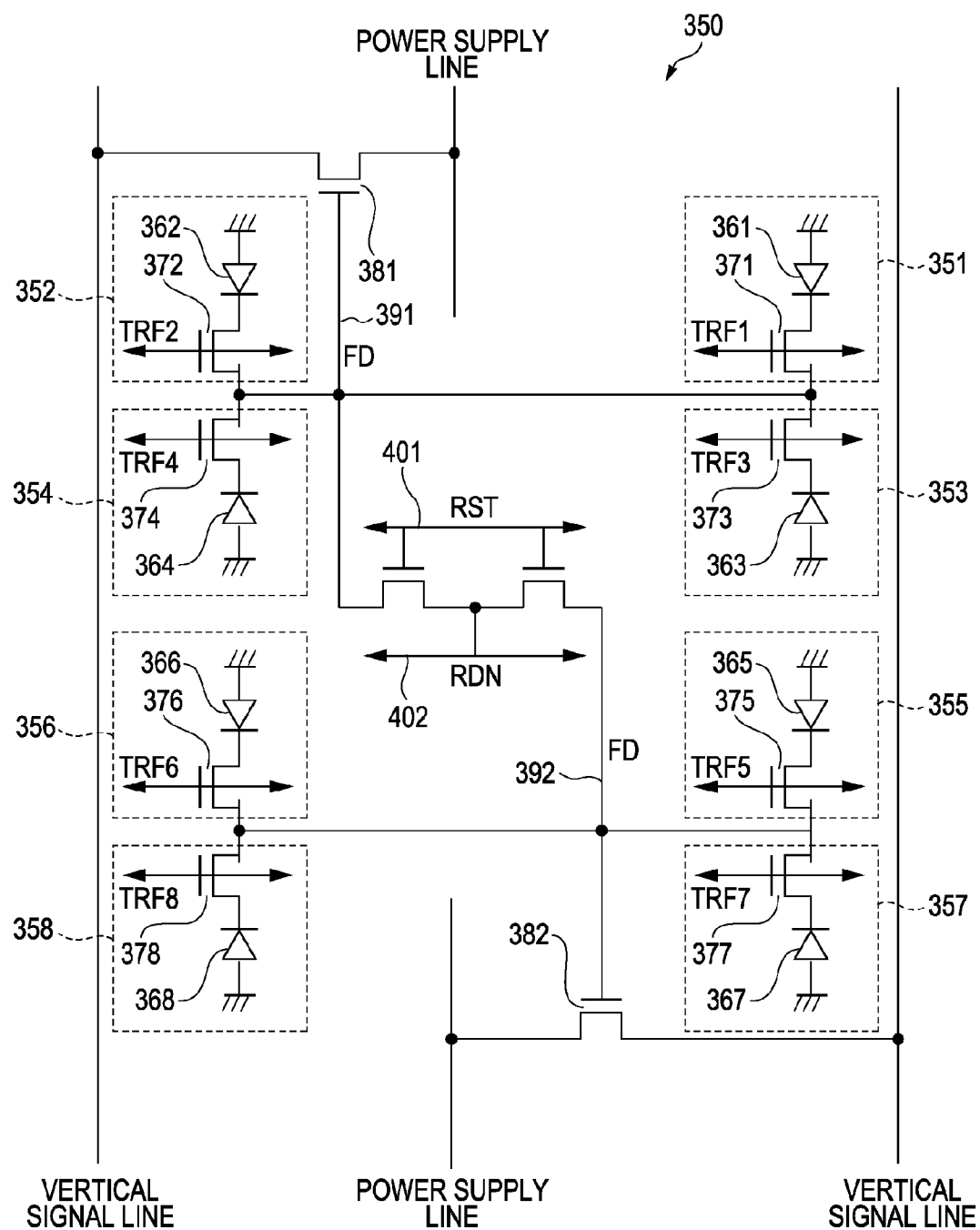
FIG. 22 illustrates an imaging apparatus to which an embodiment of the present invention has been applied.

Taking the above into account, the imaging apparatus shown in FIG. 22 is thus configured as a three-transistor type CIS, wherein the amplifier transistor AMP, the reset transistor RST, and the floating diffusion FD are shared among four adjacent pixels, with each pixel containing a photodiode PD and a transfer transistor TRF. This configuration is advantageous for raising the aperture ratio of the photodiode PD and increasing the signal (S).

Another way to improve the signal (S) involves increasing the conversion efficiency, and can be realized by decreasing the diffusion capacitance of the floating diffusion FD as well as the lead capacitance. The foregoing describes how the aperture ratio of the photodiode PD can be raised by sharing transistors among a plurality of pixels. If such multi-pixel sharing is configured such that four vertical pixels share transistors, then the diffusion region of the floating diffusion FD is split into two to five sites. Such a configuration leads to increased diffusion capacitance in the floating diffusion FD, increased length in the leads connecting these floating diffusions FD, and has the possibility of increasing the lead capacitance.

Consequently, although multi-pixel sharing is implemented, the architecture is configured such that transistors are shared among four pixels arranged in a 2×2 layout in the horizontal and vertical directions. More specifically, the floating diffusion FD region is formed in the center of four such pixels, with the transfer transistors TRF of the four adjacent pixels disposed so as to enclose the floating diffusion FD. Configuring a CIS in this way keeps the diffusion region of the floating diffusion FD to two sites: the portion adjacent to the four transfer transistors TRF (drain-side), and the source-side of the reset transistor RST. Thus, a configuration becomes possible wherein the diffusion capacitance can be decreased.

Furthermore, since these two regions are positioned close together, the length of the leads connecting these regions can be shortened. Consequently, the lead capacitance can be decreased in such a configuration. The floating diffusion FD is thus formed in the center of four pixels arranged in a 2×2 layout in the horizontal and vertical directions, with the transfer transistors TRF of the four adjacent pixels being disposed so as to enclose the floating diffusion FD. By configuring a CIS in this way, both the diffusion capacitance of the floating diffusion FD and the lead capacitance can be decreased at the same time, thereby increasing conversion efficiency and enabling improvement of the signal (S).

Further maintaining (or improving) the S/N ratio involves decreasing the noise (N). Increasing the size of the amplifier transistor AMP is a useful means for decreasing the 1/f noise constituting part of the noise (N).

Representative pixel architectures for CIS sensors include the four-transistor type, which is made up of the amplifier transistor AMP, the selection transistor SEL, the reset transistor RST, the transfer transistor TRF, and the floating diffusion FD, as well as the three-transistor type, which omits the selection transistor SEL.

In the four-transistor type, the amplifier transistor AMP and the selection transistor SEL are connected in series. However, the diffusion region between the amplifier transistor AMP and the transistor region of the selection transistor SEL are not present in the three-transistor type. Consequently, by adopting a three-transistor type, the space afforded by the above regions that are not found in the three-transistor type can be applied to reducing the pixel pitch, or to increasing the transistor size of the amplifier transistor AMP. Consequently, it is possible to decrease the noise (N) as described above by applying such space to increasing the transistor size of the amplifier transistor AMP.

Another characteristic of an image sensor is the saturation signal strength (Qs). Although the sensitivity of an image sensor is determined by the above signal (S), the dynamic range (DR) of an image sensor is improved by raising the saturation signal strength (Qs). The dynamic range is the tone information from an image sensor. If the dynamic range is narrow, then the tones in bright portions will be lost and all become white, for example, resulting in the condition referred to as "whiteout" and a loss of color information. Additionally, if the saturation signal strength (Qs) is too low, then the number of photoelectrically converted photons decreases, the proportion of the image dominated by shot noise components (which is determined by the number of photons) increases, and imaging performance suffers.

Increasing the aperture ratio of the photodiode PD is also effective for raising the saturation signal strength (Qs). By thus adopting the multi-pixel sharing architecture described above, the number of transistors per pixel is decreased, and the transistor regions are reduced, which allows for an increase in the surface area of the photodiode PD. A configuration of the present embodiment that adopts a multi-pixel sharing architecture in consideration of these additional points will be given later.

The saturation signal strength (Qs) is determined by the surface area and the depletion potential of the photodiode PD. If the depletion potential of the photodiode PD becomes deeper, then the number of electrons that can be accumulated in the photodiode PD increases, but a deep potential can also cause pixel performance degradation in the form of afterimages if the transfer transistor TRF is not fully switched on as a result. When charge transfer from the photodiode PD is considered, a potential gradient sufficient for the transfer transistor TRF is desirable. An insufficient potential gradient may cause backflow or under-transfer of charge (i.e., electron number levels) from the transfer transistor TRF to the photodiode PD due to thermal vibration.

In this way, not only the potential of the transfer transistor TRF but also the transverse electric field from the potential of the photodiode PD contributes to actual charge transfer, and raising the reset potential of the floating diffusion FD aids transfer. On the other hand, raising the continuous potential is disadvantageous from the point of view of transistor reliability. For this reason, in the present embodiment, the drain potential of the reset transistor RST is raised only during the approximate transfer operation period, with the drain potential of the reset transistor RST being lowered for all other periods. In so doing, the amount of time during which reliability suffers is suppressed to a level similar to that of the case when the potential is continuously on without being increased, and reliability is maintained. This configuration will be described later with reference to FIG. 24.

Figure 23:
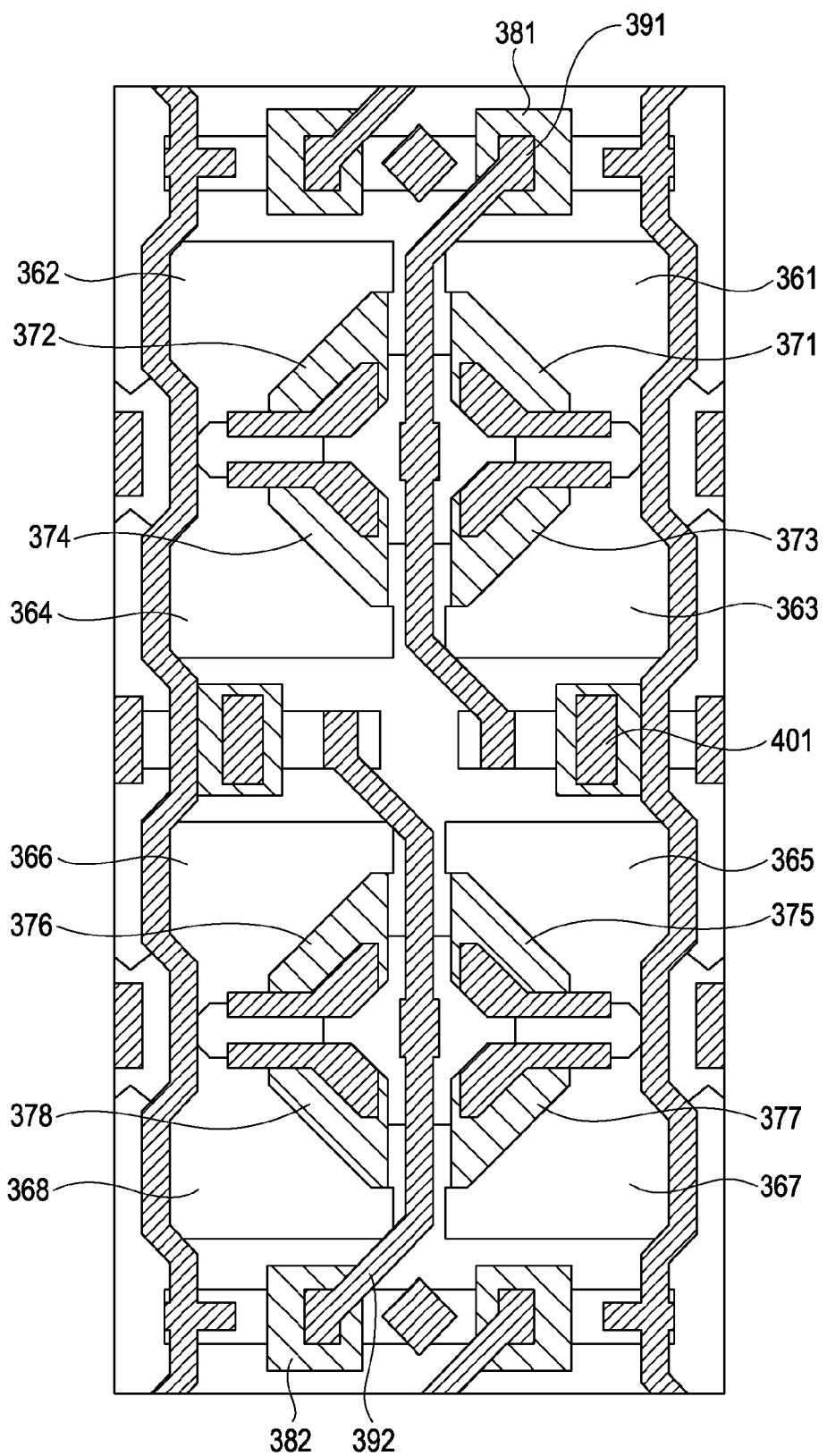
FIG. 23 illustrates a configuration of an imaging apparatus.

FIGS. 22 and 23 illustrate an imaging apparatus in accordance with an embodiment of the present invention that takes the above into account. The basic component unit of the imaging apparatus 350 shown in FIGS. 22 and 23 is a group of eight pixels arranged in a 4×2 (four vertical, two horizontal) layout. FIGS. 23 and 23 illustrate the configuration of one such basic component unit.

The imaging apparatus 350 shown in FIGS. 22 and 23 is similar to that shown in FIGS. 6 and 8, in that a single reset drain RDN is provided. Consequently, it is possible to drive the imaging apparatus 350 shown in FIGS. 22 and 23 using the same driving methods as those shown in FIG. 7 and FIGS. 12 to 21, with each driving method exhibiting its specific advantages therein.

In contrast, the imaging apparatus 350 shown in FIGS. 23 and 23 differs from that shown in FIGS. 6 and 8, in that two reset transistors RST are provided for every eight pixels.

The pixel 351 is realized by connecting a photodiode PD 361 to a transfer transistor TRF 371. The pixel 352 is realized by connecting a photodiode PD 362 to a transfer transistor TRF 372. The pixel 353 is realized by connecting a photodiode PD 363 to a transfer transistor TRF 373. The pixel 354 is realized by connecting a photodiode PD 364 to a transfer transistor TRF 374. The pixels 351 to 354 constitute four pixels arranged in a 2×2 layout in the imaging apparatus 350.

Similarly, the pixel 355 is realized by connecting a photodiode PD 365 to a transfer transistor TRF 375. The pixel 356 is realized by connecting a photodiode PD 366 to a transfer transistor TRF 376. The pixel 357 is realized by connecting a photodiode PD 367 to a transfer transistor TRF 377. The pixel 358 is realized by connecting a photodiode PD 368 to a transfer transistor TRF 378. The pixels 355 to 358 constitute four pixels arranged in a 2×2 layout in the imaging apparatus 350.

The eight pixels from the pixel 351 to the pixel 358 constitute the basic component unit of the imaging apparatus 350, being made up of pixels arranged in a 4×2 (four vertical, two horizontal) layout. Furthermore, the imaging apparatus 350 is configured such that an amplifier transistor AMP, a floating diffusion FD, and a reset transistor RST are shared by each 2×2 group of pixels.

In other words, the 2×2 group of pixels made up of the pixels 351 to 354, for example, share an amplifier transistor AMP 381, a floating diffusion FD 391, and a reset transistor RST 401. Likewise, the 2×2 group of pixels made up of the pixels 355 to 358 share an amplifier transistor AMP 382, a floating diffusion FD 392, and a reset transistor RST 402. Each individual pixel respectively includes one of the transfer transistors TRF 371 to 378.

In this way, the imaging apparatus 350 is a three-transistor type CIS, the three transistors being the amplifier transistor AMP, the reset transistor RST, and the transfer transistor TRF. The CIS has a multi-pixel sharing architecture wherein the above three transistors are shared among four adjacent pixels. As described earlier, such a CIS is advantageous for raising the aperture ratio of the photodiode PD and increasing the signal (S). Moreover, since the three-transistor type enables the size of the amplifier transistor AMP to be increased as described earlier, it is also possible to decrease the noise (N).

FIGS. 22 and 23 demonstrate how, in the basic component unit of the imaging apparatus 350, the floating diffusion FD is disposed in the center of the 2×2 group of pixels, with the transfer transistors TRF disposed in four directions around the floating diffusion FD so as to enclose the floating diffusion FD.

As a specific example, the floating diffusion FD 391 is disposed in the center the 2×2 group of pixels made up of the pixels 351 to 354, as shown in FIG. 23. Additionally, transfer transistors TRF are respectively disposed in four directions around the floating diffusion FD 391. In FIG. 23, the transfer transistors TRF 371 to 374 are disposed to the upper-right, upper-left, lower-right, and lower-left of the floating diffusion FD 391, respectively.

Similarly, the floating diffusion FD 392 is disposed in the center of the 2×2 group of pixels made up of the pixels 355 to 358, as shown in FIG. 23. Additionally, the transfer transistors TRF are disposed in four directions around the floating diffusion FD 392. In FIG. 23, the transfer transistors TRF 375 to 378 are disposed to the upper-right, upper-left, lower-right, and lower-left of the floating diffusion FD 392, respectively.

By configuring the floating diffusion FD to be enclosed by the transfer transistors TRF in four directions in this way, the effective junction surface area and junction length is reduced, thereby making it possible to decrease junction capacitance.

As shown in FIGS. 22 and 23, the imaging apparatus 350 is realized by vertically arranging two 2×2 groups of pixels. Herein, the four-pixel sharing unit made up of the pixels 351 to 354 is taken to be the upper portion (referred to as the U portion), while the four-pixel sharing unit made up of the pixels 355 to 358 is taken to be the lower portion (referred to as the D portion).

The U and D portions are disposed by joining the drains of the U and D reset transistors RST in the same diffusion layer. In so doing, an amplifier transistor AMP row and a reset transistor RST row are disposed every two rows.

In other words, since there exists an amplifier transistor AMP 381 at the top of the U portion as shown in FIG. 23, this part becomes an amplifier transistor AMP row. Since there exists a reset transistor RST 401 at the bottom of the U portion (i.e., at the top of the D portion), this part becomes a reset transistor RST row. Since there exists an amplifier transistor AMP 382 at the bottom of the D portion, this part becomes an amplifier transistor AMP row. In this way, the disposed transistor rows alternate between being amplifier transistor AMP row and reset transistor RST rows.

In the eight pixels of the basic component unit, the gates of the transfer transistors TRF are respectively connected to control lines (TRF1, TRF2, TRF3, TRF4, TRF5, TRF6, TRF7, and TRF8). In so doing, the number of transistors per pixel becomes $(1 \times 4 + 2)/4 = 1.5$.

Since the floating diffusion FD 391, for example, is thus enclosed in four directions by the transfer transistors TRF 371 to 374, the effective junction surface area and junction length can be reduced, and the P-N junction capacitance can be decreased in an imaging apparatus 350 to which an embodiment of the present invention has been applied. As a result, the conversion efficiency is improved and the signal (S) is increased.

In addition, since the floating diffusion FD region and the reset transistor RST source region are disposed in spatial proximity, the lengths of the leads joining these elements can be shortened. As a result, the conversion efficiency is improved and the signal (S) is increased. Also, since the signal output lines from each pixel 351 to 358 (i.e., the vertical signal lines) are joined every other row as shown in FIG. 22, the lengths of the leads can be further shortened in the imaging apparatus 350.

By adopting a configuration like the above, it becomes possible to increase the signal (S). As a result, even if the imaging apparatus 350 is miniaturized, it becomes possible to prevent the degradation of imaging characteristics.

The operation of the imaging apparatus 350 will now be described. Operation will be described with reference to FIG. 24, for the case when a reset drain voltage (RDN) 402 is applied. At the time t1, a pulse is applied to the reset drain electrode RDN 402, thereby causing the reset transistor RST 401 to go high. When a pulse potential is not applied, the voltage of the reset drain electrode RDN 402 is taken to be 0.6 V, for example. When a pulse potential is applied, the voltage is taken to be Vdd (i.e., the drain potential of the amplifier transistor AMP).

Additionally, the voltage of the reset transistor RST 401 is taken to be Vdd when high, and −1 V or 0 V when low. A pulse is also applied to the drain electrode of the reset transistor RST 401, while a fixed potential is applied to the drain electrode of the amplifier transistor AMP 381 (or 382).

Figure 24:
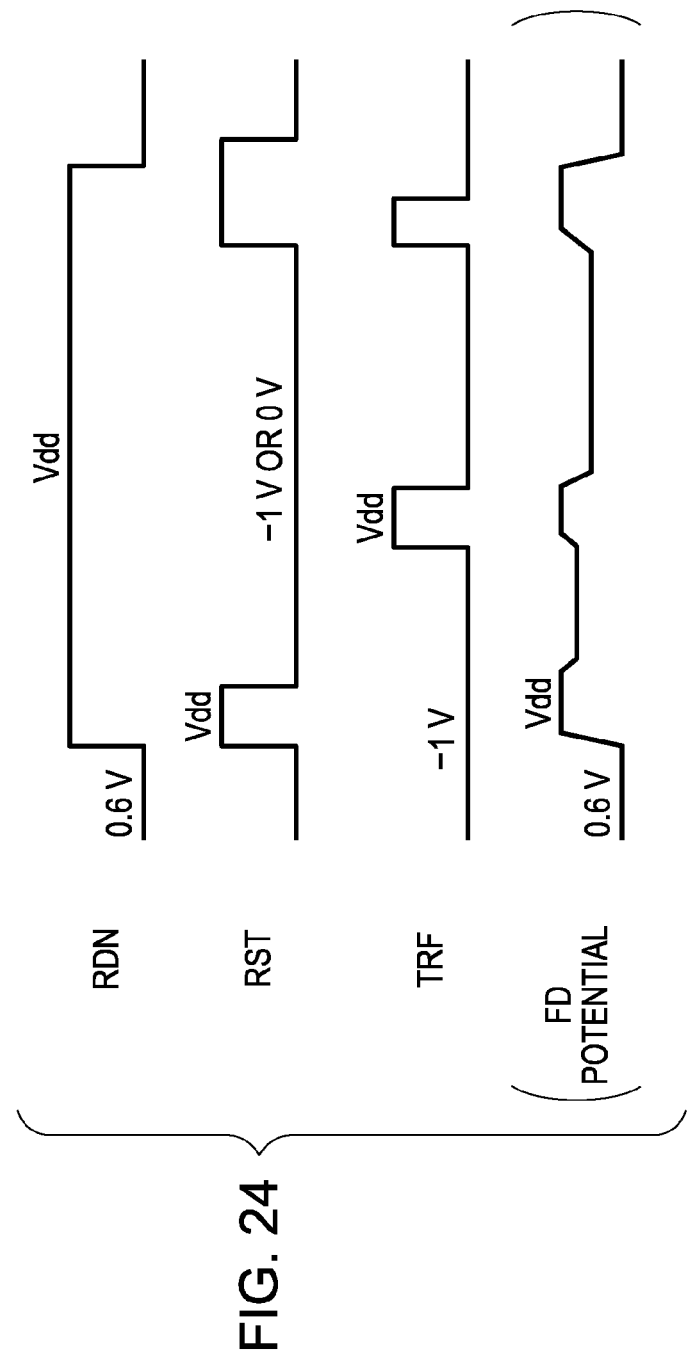
FIG. 24 illustrates variation of potential in an imaging apparatus.
Figure 25:
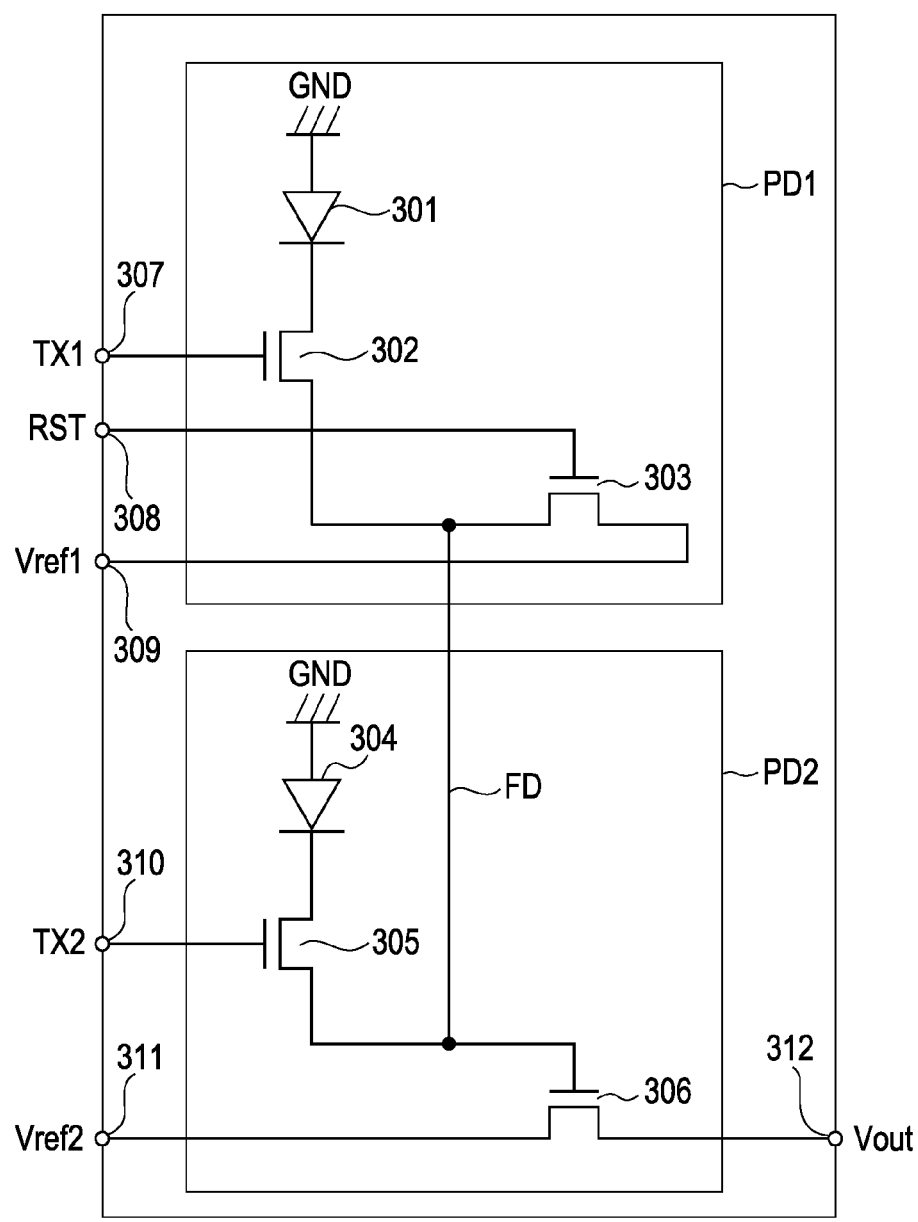
FIG. 25 illustrates an exemplary configuration of an imaging apparatus of the related art.

When the threshold potential Vth of the reset transistor RST 401 is set to a potential such that the potential of the floating diffusion FD undergoes a hard reset, the potential of the floating diffusion FD is set to one of the following: the potential of the reset drain electrode RDN 402, or the coupled potential from the potential of the reset drain electrode RDN 402 when the reset transistor RST 401 is off. FIG. 24 shows the pulse state for the case when the potential becomes identical to the potential of the reset drain electrode RDN 402.

Returning to FIG. 22, the amplifier transistor AMP 381 (or the amplifier transistor AMP 382) and the reset drain electrode RDN 402 are shown to be on separate lines. More specifically, the reset drain electrode 402 of the reset transistor RST 401 and the drain electrode of the amplifier transistor AMP 381 (or 382) are on separate lines. For this reason, it is possible to separately control the reset transistor RST 401 and the amplifier transistor AMP 381 (or 382).

Consequently, it is possible to conduct control such that the potential resulting when a pulse is applied to the reset drain electrode RDN 402 is not Vdd, but instead a potential higher than Vdd. For example, the potential of the reset drain electrode RDN 402 when a pulse is applied may be set to be a potential (Vdd+0.3 V) raised from Vdd.

Similarly, when the reset transistor RST 401 is in the high state, its potential may be set to a potential (Vdd+0.3 V) raised from Vdd. Moreover, when the potential of the reset drain electrode RDN 402 is raised, the potentials of the transfer transistors TRF (such as the transfer transistor TRF 371) as well as the potential of the floating diffusion FD (such as the floating diffusion FD 391) also become the raised potential, such as the potential (Vdd+0.3 V) raised from Vdd.

In this way, by applying a potential higher than Vdd to the drain potential of the reset transistor RST 401 (i.e., to the potential of the reset drain electrode RDN 402), it becomes possible to raise the potential of the floating diffusion FD higher than Vdd. For this reason, a margin for charge transfer from the photodiodes PD can be realized, and the saturation signal strength (Qs) of the photodiodes PD can be increased to alleviate concerns regarding afterimages.

Furthermore, the drain potential of the reset transistor RST is controlled so as to be raised only during the approximate transfer operation period, and lowered for all other periods. As described above, doing so suppresses the amount of time during which reliability suffers to a level similar to that of the case when the potential is continuously on without being increased, and reliability is maintained.

By thus controlling the drain potential of the reset transistor RST 401 (i.e., the reset drain voltage 402), it becomes possible to increase the saturation signal strength (Qs) and improve the dynamic range (DR) characteristics of the image sensor. Moreover, by improving the dynamic range (DR), it becomes possible to prevent the condition referred to as "whiteout" and consequent loss of color information. Moreover, since the saturation signal strength (Qs) can be increased, the number of photoelectrically converted photons increases, and the proportion of the image dominated by shot noise components (which is determined by the number of photons) decreases. As a result, it becomes possible to prevent degradation of imaging characteristics.

As shown in FIGS. 22 and 23, the imaging apparatus 350 in accordance with an embodiment of the present invention is configured such that the transfer transistors TRF in individual pixels can be separately driven. For this reason, it becomes possible to refine the driving of each per-pixel transistor. By making such refinements, output lines can be exclusively utilized, even when the output lines from each pixel are joined every other adjacent column. Furthermore, since such utilization becomes possible, circuits connecting to the output signal lines (such as column ADCs, for example) may be disposed on every other column, rather than on every column. Since the layout thus contains fewer components, it becomes possible to reduce the circuit scale, reduce the chip die surface area. As a result, increases in yield and decreases in manufacturing costs can be expected.

Furthermore, since it becomes possible to separately drive the transfer transistors TRF in individual pixels, circuits connecting to the output signal lines from each pixel (such as column ADCs, for example) may be disposed on every column, and pulses enabling simultaneous readout can be input. For this reason, it becomes possible to adapt the imaging apparatus 350 for fast readout (i.e., high framerates) or readout operations for increased numbers of pixels. The imaging apparatus 350 can be further adaptable to fast readout by refining the signal pulses.

It is also possible to drive the imaging apparatus shown in FIGS. 6 and 8 using the same driving method as that shown in FIG. 4, with that driving method exhibiting its specific advantages therein.

The pixel unit of the above embodiment may also be applied to a camera system equivalent to that shown in FIG. 9.

However, it should be appreciated that embodiments of the present invention are not limited to those described in the foregoing, and that various modifications are possible without departing from the scope and spirit of the present invention.

The present application contains subject matter related to that disclosed in Japanese Priority Patent Application JP 2008-271673 filed in the Japan Patent Office on Oct. 22, 2008, Japanese Priority Patent Application JP 2009-129783 filed in the Japan Patent Office on May 29, 2009, and Japanese Priority Patent Application JP 2008-316452 filed in the Japan Patent Office on Dec. 12, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A device, comprising:
   a plurality of charge-to-voltage converters;
   a pixel array having a plurality of pixels arranged therein, each pixel including a photodetector as well as a transfer transistor configured to transfer charge photoelectrically converted by the photodetector to one of the charge-to-voltage converters;
   a plurality of reset transistors configured to reset the photodetectors;
   a plurality of amplifier transistors configured to output a signal corresponding to the potential of the photodetectors;
   a reset gate power supply for the reset transistor; and
   an amplifier power supply for the reset transistor,
   wherein,
      the reset transistor, the amplifier transistor and the charge-to-voltage converter are shared by at least two pixels,
      the reset gate power supply has a voltage level that is higher than a voltage level of the amplifier power supply,
      the voltage level of the amplifier power supply is fixed, and the reset gate power supply selectively takes either a first voltage level or a second voltage level, the second voltage level being higher than the first voltage level, each of the first and second voltage levels being higher than the voltage level of the amplifier power supply.

2. The device of claim 1, further comprising:
a booster circuit, both the booster circuit and the pixel array being on a same substrate;
wherein
the voltage level of the reset gate power supply is generated as a result of the booster circuit boosting the voltage level of the amplifier power supply.

3. A method for driving a device including a plurality of charge-to-voltage converters, a pixel array having a first plurality of pixels arranged therein, each pixel including a photodetector as well as a transfer gate configured to transfer charge photoelectrically converted by the photodetector to one of the charge-to-voltage converters, a plurality of reset gates configured to reset the photodetectors, a plurality of amplifiers configured to output a signal corresponding to the potential of the photodetectors, a reset gate power supply, and an amplifier power supply, wherein a second plurality of pixels share one each of the charge-to-voltage converters, reset gates and amplifiers, wherein the second plurality of pixels is a subset of the first plurality of pixels, the method comprising the steps of:
setting the voltage level of the reset gate power supply higher than the voltage level of the amplifier power supply; and
resetting the charge-to-voltage converters to the voltage level of the reset gate power supply.

4. An imaging apparatus, comprising:
a solid state image sensor, and
optics configured to focus incident light onto the photodetector surface of the solid state image sensor,
wherein,
the solid state image sensor includes a plurality of charge-to-voltage converters, a pixel array having a first plurality of pixels arranged therein, each pixel including a photodetector as well as a transfer gate configured to transfer charge photoelectrically converted by the photodetector to one of the charge-to-voltage converters, a plurality of reset gates configured to reset the photodetectors, a plurality of amplifiers configured to output a signal corresponding to the potential of the photodetectors, a reset gate power supply, and an amplifier power supply,
a second plurality of pixels share one each of the charge-to-voltage converters, reset gates and amplifiers, wherein the second plurality of pixels is a subset of the first plurality of pixels,
the reset gate power supply has a voltage level that is higher than a voltage level of the amplifier power supply.

5. A device, comprising:
a plurality of charge-to-voltage converters;
a pixel array having a first plurality of pixels arranged therein, each pixel including a photodetector as well as a transfer gate configured to transfer charge photoelectrically converted by the photodetector to one of the charge-to-voltage converters;
a plurality of reset gates configured to reset the photodetectors; and
a plurality of amplifiers configured to output a signal corresponding to the potential of the photodetectors,
wherein,
a second plurality of pixels share one each of the charge-to-voltage converters, reset gates and amplifiers,
the second plurality of pixels is defined to be four consecutive pixels belonging to the same pixel column, with adjacent pixels among the four pixels being paired into two groups, wherein the second plurality of pixels is a subset of the first plurality of pixels,
in one group, a charge-to-voltage converter and a reset gate are shared between the two pixels therein, with the reset gate being disposed between the respective photodetector regions of the two pixels, and
in the other group, a charge-to-voltage converter and an amplifier are shared between the two pixels therein, with the amplifier being disposed between the respective photodetector regions of the two pixels.

6. The solid state image sensor according to claim 5 device of claim 5, wherein
each charge-to-voltage converter includes a first charge-to-voltage converter disposed between the respective photodetector regions of the two pixels in one group, and a second charge-to-voltage converter disposed between the respective photodetector regions of the two pixels in the other group, and
the first and second charge-to-voltage converters are electrically connected to each other.

7. An imaging apparatus, comprising:
a solid state image sensor, and
optics configured to focus incident light onto the photodetector surface of the solid state image sensor,
wherein,
the solid state image sensor includes a plurality of charge-to-voltage converters, a pixel array having a first plurality of pixels arranged therein, each pixel including a photodetector as well as a transfer gate configured to transfer charge photoelectrically converted by the photodetector to one of the charge-to-voltage converters, a plurality of reset gates configured to reset the photodetectors, and a plurality of amplifiers configured to output a signal corresponding to the potential of the photodetectors,
a second plurality of pixels share one each of the charge-to-voltage converters, reset gates and amplifiers,
the second plurality of pixels is defined to be four consecutive pixels belonging to the same pixel column, with adjacent pixels among the four pixels being paired into two groups, wherein the second plurality of pixels is a subset of the first plurality of pixels,
in one group, a charge-to-voltage converter and a reset gate are shared between the two pixels therein, with the reset gate being disposed between the respective photodetector regions of the two pixels, and
in the other group, a charge-to-voltage converter and an amplifier are shared between the two pixels therein, with the amplifier being disposed between the respective photodetector regions of the two pixels.

8. An imaging apparatus, comprising:
a pixel array having a plurality of pixels arranged therein, each pixel including a transfer transistor;
a plurality of floating diffusion regions, each provided in the center of four pixels arranged in a 2×2 layout in the horizontal and vertical directions;
a plurality of amplifier transistors; and
a plurality of reset transistors, wherein the drain electrode of each reset transistor and the drain electrode of each amplifier transistor are disposed separately, and wherein,
the transfer transistors constituting the four pixels are disposed in four directions around the floating diffusion, such that the floating diffusion is enclosed by the transfer transistors,
each floating diffusion, amplifier transistor, and reset transistor are shared among the four pixels, and
a group of eight pixels formed by vertically disposing two sets of the four pixels is taken to be the basic component unit of the pixel array.

9. An imaging apparatus, comprising:
a pixel array having a plurality of pixels arranged therein, each pixel including a transfer transistor;
a plurality of floating diffusion regions, each provided in the center of four pixels arranged in a 2×2 layout in the horizontal and vertical directions;
a plurality of amplifier transistors; and
a plurality of reset transistors,
wherein,
the transfer transistors constituting the four pixels are disposed in four directions around the floating diffusion, such that the floating diffusion is enclosed by the transfer transistors,
each floating diffusion, amplifier transistor, and reset transistor are shared among the four pixels, and
a group of eight pixels formed by vertically disposing two sets of the four pixels is taken to be the basic component unit of the pixel array, wherein a pulse is applied to the drain electrode of each reset transistor, and a constant potential is applied to the drain electrode of each amplifier transistor.

10. A device, comprising:
a plurality of charge-to-voltage converters;
a pixel array having a first plurality of pixels arranged therein, each pixel including a photodetector as well as a transfer gate configured to transfer charge photoelectrically converted by the photodetector to one of the charge-to-voltage converters;
a plurality of reset gates configured to reset the photodetectors;
a plurality of amplifiers configured to output a signal corresponding to the potential of the photodetectors;
a reset gate power supply; and
an amplifier power supply,
wherein,
a second plurality of pixels share one each of the charge-to-voltage converters, reset gates and amplifiers, and
the reset gate power supply has a voltage level that is higher than a voltage level of the amplifier power supply, and
wherein the drain electrode of each reset gate and the drain electrode of each amplifier are disposed separately.

11. A device, comprising:
a plurality of charge-to-voltage converters;
a pixel array having a first plurality of pixels arranged therein, each pixel including a photodetector as well as a transfer gate configured to transfer charge photoelectrically converted by the photodetector to one of the charge-to-voltage converters;
a plurality of reset gates configured to reset the photodetectors;
a plurality of amplifiers configured to output a signal corresponding to the potential of the photodetectors;
a reset gate power supply; and
an amplifier power supply,
wherein,
a second plurality of pixels share one each of the charge-to-voltage converters, reset gates and amplifiers, and
the reset gate power supply has a voltage level that is higher than a voltage level of the amplifier power supply, and
wherein a pulse is applied to the drain electrode of each reset gate, and a constant potential is applied to the drain electrode of each amplifier.

12. A device, comprising:
a plurality of charge-to-voltage converters;
a pixel array having a first plurality of pixels arranged therein, each pixel including a photodetector as well as a transfer gate configured to transfer charge photoelectrically converted by the photodetector to one of the charge-to-voltage converters;
a plurality of reset gates configured to reset the photodetectors;
a plurality of amplifiers configured to output a signal corresponding to the potential of the photodetectors;
a reset gate power supply; and
an amplifier power supply,
wherein,
a second plurality of pixels share one each of the charge-to-voltage converters, reset gates and amplifiers,
the reset gate power supply has a voltage level that is higher than a voltage level of the amplifier power supply, and
wherein the second plurality of pixels is a subset of the first plurality of pixels.

13. A device, comprising:
a plurality of charge-to-voltage converters;
a pixel array having a first plurality of pixels arranged therein, each pixel including a photodetector as well as a transfer gate configured to transfer charge photoelectrically converted by the photodetector to one of the charge-to-voltage converters;
a plurality of reset gates configured to reset the photodetectors; and
a plurality of amplifiers configured to output a signal corresponding to the potential of the photodetectors,
wherein,
a second plurality of pixels share one each of the charge-to-voltage converters, reset gates and amplifiers,
the second plurality of pixels is defined to be four consecutive pixels belonging to the same pixel column, with adjacent pixels among the four pixels being paired into two groups,
in one group, a charge-to-voltage converter and a reset gate are shared between the two pixels therein, with the reset gate being disposed between the respective photodetector regions of the two pixels, and
in the other group, a charge-to-voltage converter and an amplifier are shared between the two pixels therein, with the amplifier being disposed between the respective photodetector regions of the two pixels, wherein the drain electrode of each reset gate and the drain electrode of each amplifier are disposed separately.

14. A device, comprising:
a plurality of charge-to-voltage converters,
a pixel array having a first plurality of pixels arranged therein, each pixel including a photodetector as well as a transfer gate configured to transfer charge photoelectrically converted by the photodetector to one of the charge-to-voltage converters;
a plurality of reset gates configured to reset the photodetectors; and a plurality of amplifiers configured to output a signal corresponding to the potential of the photodetectors, wherein,
- a second plurality of pixels share one each of the charge-to-voltage converters, reset gates and amplifiers,
- the second plurality of pixels is defined to be four consecutive pixels belonging to the same pixel column, with adjacent pixels among the four pixels being paired into two groups,
- in one group, a charge-to-voltage converter and a reset gate are shared between the two pixels therein, with the reset gate being disposed between the respective photodetector regions of the two pixels, and
- in the other group, a charge-to-voltage converter and an amplifier are shared between the two pixels therein, with the amplifier being disposed between the respective photodetector regions of the two pixels, wherein a pulse is applied to the drain electrode of each reset gate, and a constant potential is applied to the drain electrode of each amplifier.

* * * * *